US012641767B2

(12) United States Patent
Wang et al.

(10) Patent No.: US 12,641,767 B2
(45) Date of Patent: May 26, 2026

(54) MULTI-PORT SRAM STRUCTURE WITH GATE-ALL-AROUND TRANSISTORS

(71) Applicant: Taiwan Semiconductor Manufacturing Company, Ltd., Hsin-Chu (TW)

(72) Inventors: Ping-Wei Wang, Hsin-Chu (TW); Feng-Ming Chang, Hsinchu County (TW); Jui-Lin Chen, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 383 days.

(21) Appl. No.: 18/364,716

(22) Filed: Aug. 3, 2023

(65) Prior Publication Data

US 2024/0306358 A1 Sep. 12, 2024

Related U.S. Application Data

(60) Provisional application No. 63/489,211, filed on Mar. 9, 2023.

(51) Int. Cl.

| | |
|---|---|
| *H10B 10/00* | (2023.01) |
| *G11C 11/412* | (2006.01) |
| *G11C 11/419* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2026.01) |

(Continued)

(52) U.S. Cl.
CPC ............ *H10B 10/12* (2023.02); *G11C 11/412* (2013.01); *G11C 11/419* (2013.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 84/0167* (2025.01); *H10D 84/038* (2025.01); *H10D 84/85* (2025.01)

(58) Field of Classification Search
CPC ..... H10B 10/12; G11C 11/412; G11C 11/419; H10D 30/014; H10D 30/43; H10D 30/6735; H10D 30/6757; H10D 62/121; H10D 64/017; H10D 84/0167; H10D 84/038; H10D 84/85
See application file for complete search history.

(56) References Cited

U.S. PATENT DOCUMENTS

| | | |
|---|---|---|
| 8,605,523 B2 | 12/2013 | Tao et al. |
| 8,630,132 B2 | 1/2014 | Cheng et al. |
| 8,760,948 B2 | 6/2014 | Tao et al. |

(Continued)

*Primary Examiner* — Jay C Kim
*Assistant Examiner* — Woo K Lee
(74) *Attorney, Agent, or Firm* — HAYNES AND BOONE, LLP

(57) ABSTRACT

A memory cell includes a first active region providing a plurality of first nano-structures for a write-port pass-gate transistor, a second active region providing a plurality of second nano-structures for a write-port pull-up transistor, and a third active region providing a plurality of third nano-structures for a read-port pull-down transistor. The first active region has a first width, the second active region has a second width, and the third active region having a third width. The third width is larger than the first width, and the first width is larger than the second width.

20 Claims, 22 Drawing Sheets

(51) Int. Cl.
  *H10D 84/03* (2025.01)
  *H10D 84/85* (2025.01)

(56) References Cited

U.S. PATENT DOCUMENTS

| | | | |
|---|---|---|---|
| 8,942,030 | B2 | 1/2015 | Liaw |
| 10,163,495 | B2 | 12/2018 | Liaw |
| 2014/0032871 | A1 | 1/2014 | Hsu et al. |
| 2014/0153321 | A1 | 6/2014 | Liaw |
| 2014/0153345 | A1 | 6/2014 | Kim et al. |
| 2014/0177352 | A1 | 6/2014 | Lum |
| 2014/0233330 | A1 | 8/2014 | Ko et al. |
| 2014/0241077 | A1 | 8/2014 | Katoch et al. |
| 2014/0269114 | A1 | 9/2014 | Yang et al. |
| 2018/0061487 | A1 | 3/2018 | Liaw |

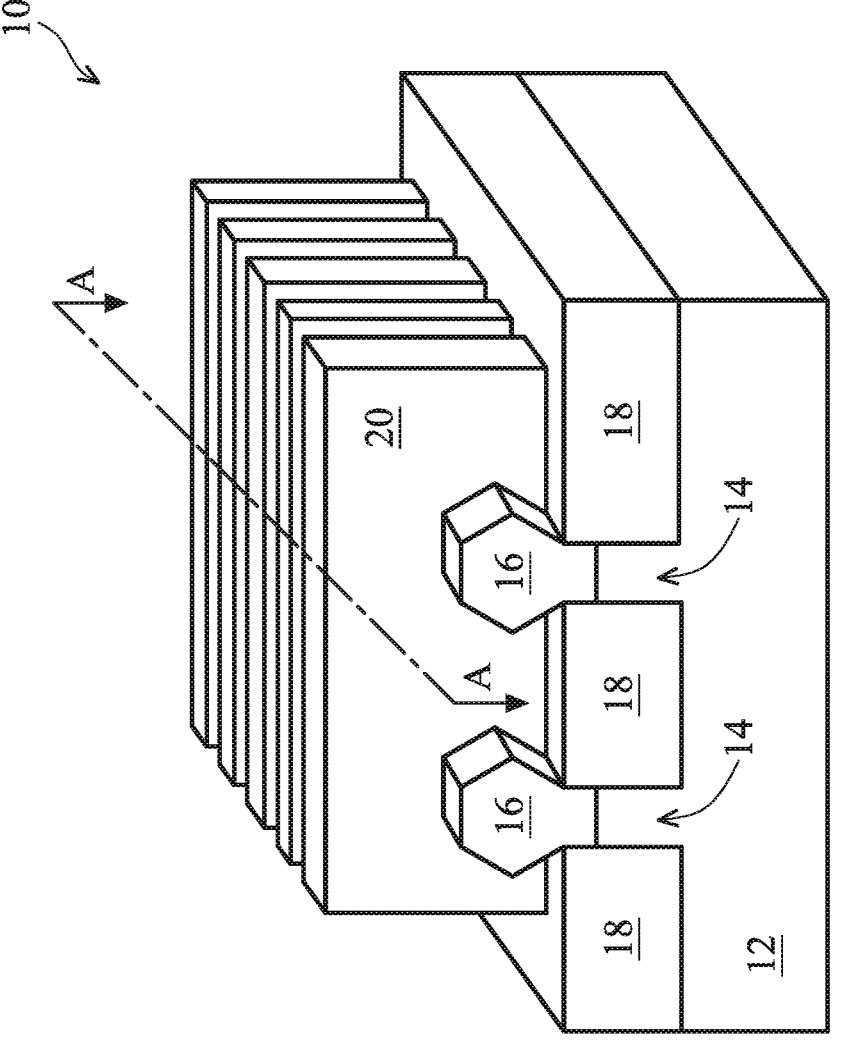
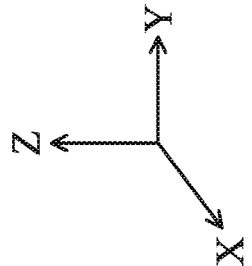
FIG. 1A

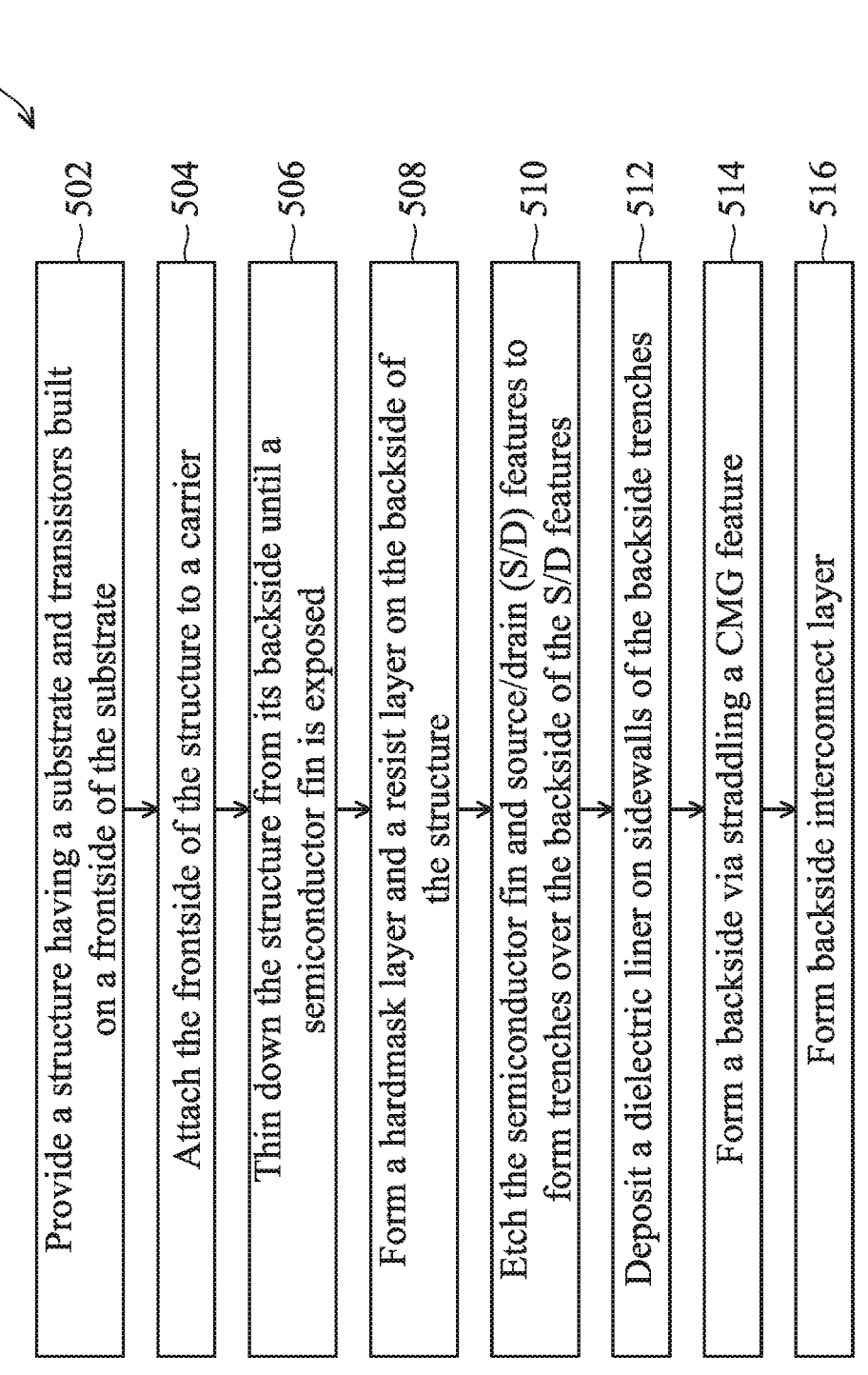

500

502 — Provide a structure having a substrate and transistors built on a frontside of the substrate 504 — Attach the frontside of the structure to a carrier 506 — Thin down the structure from its backside until a semiconductor fin is exposed 508 — Form a hardmask layer and a resist layer on the backside of the structure 510 — Etch the semiconductor fin and source/drain (S/D) features to form trenches over the backside of the S/D features 512 — Deposit a dielectric liner on sidewalls of the backside trenches 514 — Form a backside via straddling a CMG feature 516 — Form backside interconnect layer

FIG. 12

MULTI-PORT SRAM STRUCTURE WITH GATE-ALL-AROUND TRANSISTORS

PRIORITY DATA

This application claims priority to U.S. Provisional Patent Application No. 63/489,211 filed on Mar. 9, 2023, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In deep sub-micron integrated circuit technology, static random-access memory (SRAM) device has become a popular storage unit of high-speed communication, image processing, and system-on-chip (SOC) products. The amount of embedded SRAM in microprocessors and SOCs increases to meet the performance requirement in new technology generations. As silicon technology continues to scale from one generation to the next, conventional SRAM devices and/or the fabrication thereof may encounter limitations. For example, the read-port and the write-port of SRAM devices may have different concerns and requirements. However, conventional SRAM design has not sufficiently taken these differences into account. As a result, SRAM read performance and/or write performance has not been sufficiently optimized. As another example, SRAM devices have traditionally been fabricated based on planar devices or FinFET devices. As the device scaling down process continues, planar devices or even FinFET devices may not be able to meet the demands or flexibility requirements of newer generation of SRAM devices.

Therefore, although existing SRAM devices have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A and 1B illustrate a perspective view and a top view of a portion of a memory device, respectively, in accordance with some embodiments of the present disclosure.

FIG. 12 shows a flow chart of a method for forming an integrated circuit having a plurality of SRAM cells, in accordance with some embodiments of the present disclosure.

DETAILED DESCRIPTION

Figure 1B:
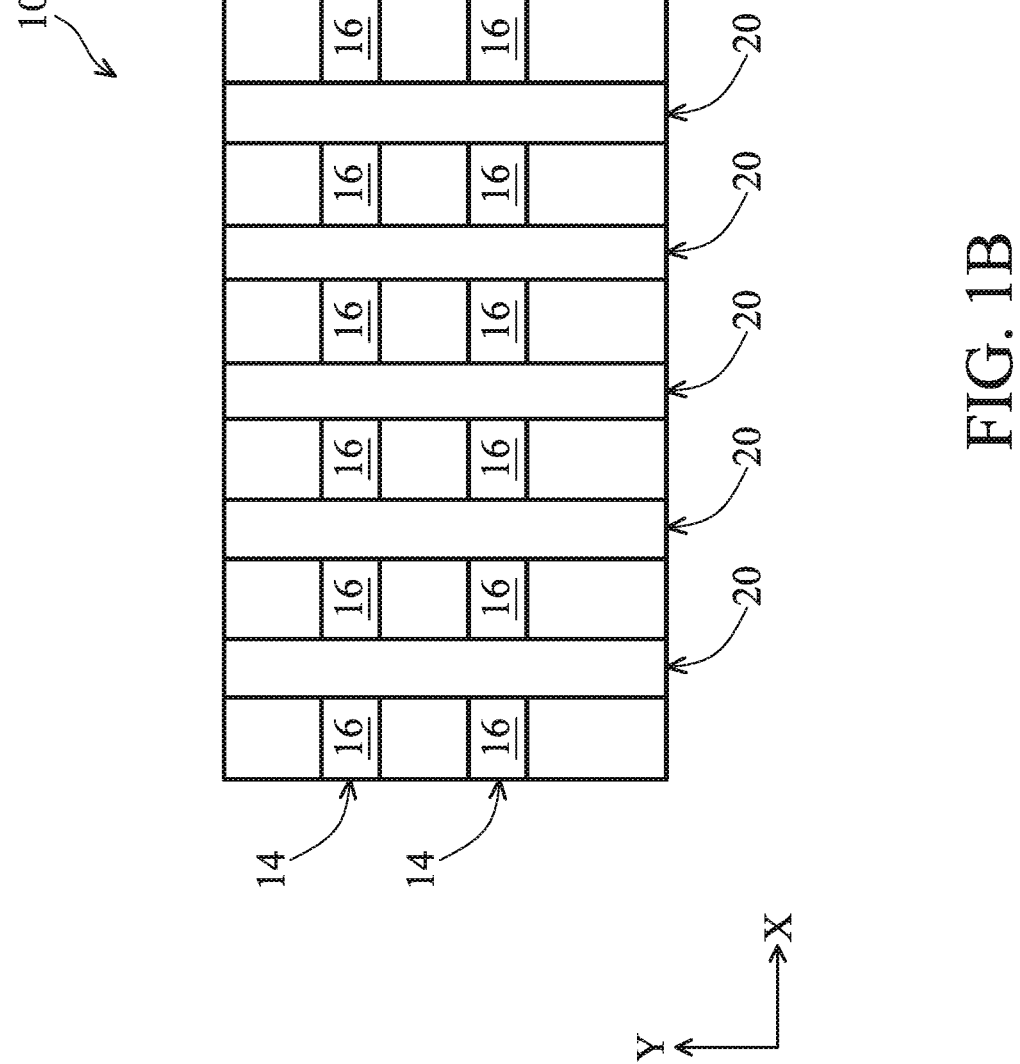

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical." "above," "over." "below." "beneath," "up," "down," "top." "bottom." etc. as well as derivatives thereof (e.g., "horizontally." "downwardly." "upwardly." etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to static random-access memories (SRAM) structures, more particularly, multi-port SRAM cells. Two-port (2P) SRAM cells and the corresponding layout are provided in accordance with various exemplary embodiments. Some variations of some embodiments are discussed. Some exemplary embodiments are related to, but not otherwise limited to, multi-gate devices.

Multi-gate devices have been introduced in an effort to improve gate control by increasing gate-channel coupling, reduce OFF-state current, and reduce short-channel effects (SCEs). One such multi-gate device that has been introduced is the fin-like field-effect transistor (FinFET). The FinFET gets its name from the fin-like structure which extends from a substrate on which it is formed, and which is used to form the FET channel. Another multi-gate device, introduced in part to address performance challenges associated with the FinFET, is the gate-all-around (GAA) transistor. The GAA transistor gets its name from the gate structure which can extend around the channel region (e.g., a stack of nanosheets) providing access to the channel on four sides. The GAA transistor is compatible with conventional complementary metal-oxide-semiconductor (CMOS) processes and its structure allows it to be aggressively scaled while maintaining gate control and mitigating SCEs. The following disclosure will continue with one or more GAA examples to illustrate various embodiments of the present disclosure.

The details of the device structures of the present disclosure are described in the attached drawings. The drawings have outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

FIGS. 1A and 1B illustrate a perspective view and a top view, respectively, of a portion of an Integrated Circuit (IC) device 10, such as an SRAM device, that is implemented using GAA transistors. Referring to FIG. 1A, the IC device 10 includes a substrate 12. The substrate 12 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 12 may be a single-layer material having a uniform composition. Alternatively, the substrate 12 may include multiple material layers having similar or different compositions suitable for IC device manufacturing. In one example, the substrate 12 may be a silicon-on-insulator (SOI) substrate having a semiconductor silicon layer formed on a silicon oxide layer. In another example, the substrate 12 may include a conductive layer, a semiconductor layer, a dielectric layer, other layers, or combinations thereof. Various doped regions, such as source/drain (S/D) regions, may be formed in or on the substrate 12. The doped regions may be doped with n-type dopants, such as phosphorus or arsenic, and/or p-type dopants, such as boron, depending on design requirements. The doped regions may be formed directly on the substrate 12, in a P-well structure, in an N-well structure, in a dual-well structure, or using a raised structure. Doped regions may be formed by implantation of dopant atoms, in-situ doped epitaxial growth, and/or other suitable techniques.

Figure 2:
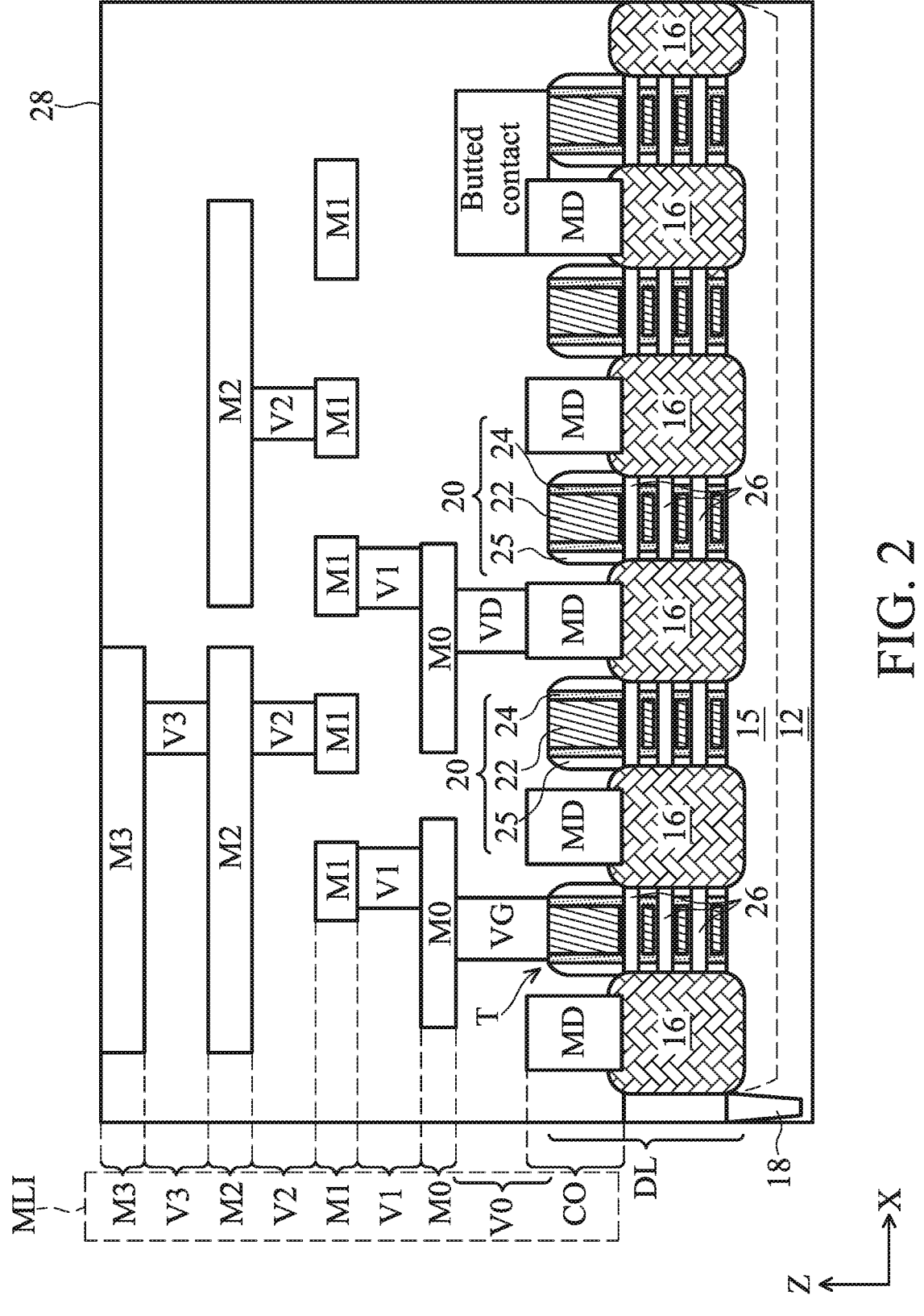
FIG. 2 illustrates a cross-sectional view of various layers of a memory device, in accordance with some embodiments of the present disclosure.

Three-dimensional active regions 14 are formed on the substrate 12. An active region for a transistor refers to the area where a source region, a drain region, and a channel region under a gate structure of the transistor are formed. An active region is also referred to as an "oxide-definition (OD) region" in the context. Each of the active regions 14 includes elongated nanostructures 26 (as shown in FIG. 2) vertically stacked in channel regions defined in the active region and above a fin-shape base. The fin-shape base protrudes upwardly out of the substrate 12. Source/drain features 16 are formed in source/drain regions defined in the active region and over the fin-shape base. The source/drain features 16 abut the two opposing ends of the nanostructures 26. The source/drain features 16 may include epi-layers that are epitaxially grown on the fin-shape base.

The IC device 10 further includes isolation structures (or isolation features) 18 formed over the substrate 12. The isolation structures 18 electrically separate various components of the IC device 10. The isolation structures 18 may include silicon oxide, silicon nitride, silicon oxynitride, fluoride-doped silicate glass (FSG), a low-k dielectric material, and/or other suitable materials. In some embodiments, the isolation structures 18 may include shallow trench isolation (STI) features. In one embodiment, the isolation structures 18 are formed by etching trenches in the substrate 12 during the formation of the active regions 14. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 18. Alternatively, the isolation structures 18 may include a multi-layer structure, for example, having one or more thermal oxide liner layers.

The IC device 10 also includes gate structures (or gate stacks) 20 formed over and engaging the active regions 14. The gate structures 20 may be dummy gate structures (e.g., containing an oxide gate dielectric and a polysilicon gate electrode), or they may be high-k metal gate (HKMG) structures that contain a high-k gate dielectric and a metal gate electrode, where the HKMG structures are formed by replacing the dummy gate structures. Though not depicted herein, the gate structure 20 may include additional material layers, such as an interfacial layer, a capping layer, other suitable layers, or combinations thereof.

Referring to FIG. 1B, multiple active regions 14 are oriented lengthwise along the X-direction, and multiple gate structures 20 are oriented lengthwise along the Y-direction, i.e., generally perpendicular to the active regions 14. At intersections of the active regions 14 and the gate structures 20, transistors are formed. In many embodiments, the IC device 10 includes additional features such as gate spacers disposed along sidewalls of the gate structures 20, and numerous other features.

FIG. 2 is a fragmentary diagrammatic cross-sectional view along A-A line of FIG. 1A, which shows various layers (levels) that can be fabricated over the substrate 12, according to various aspects of the present disclosure. In FIG. 2, the various layers include a device layer DL and a multilayer interconnect MLI disposed over the device layer DL. Device layer DL includes devices (e.g., transistors, resistors, capacitors, and/or inductors) and/or device components (e.g., doped wells, gate structures, and/or source/drain features). In some embodiments, device layer DL includes the substrate 12, doped regions 15 disposed in the substrate 12 (e.g., n-wells and/or p-wells), isolation features 18, and transistors T. In the depicted embodiment, transistors T include suspended nanostructures (channel layers) 26 and the gate structures 20 disposed between source/drain features 16, where the gate structures 20 wrap and/or surround the suspended nanostructures 26. The nanostructures 26 may include nanosheets, nanotubes, or nanowires, or some other type of nanostructure that extends horizontally in the X-direction. Each gate structure 20 has a metal gate structure formed from a gate electrode 22 disposed over a gate dielectric 24 and gate spacers 25 disposed along sidewalls of the metal gate structure.

Multilayer interconnect MLI electrically couples various devices and/or components of device layer DL, such that the various devices and/or components can operate as specified by design requirements for the memory. In the depicted embodiment, multilayer interconnect MLI includes a contact layer (CO level), a via zero layer (V0 level), a metal zero (M0) level, a via one layer (V1 level), a metal one layer (M1 level), a via two layer (V2 level), a metal two layer (M2 level), a via three layer (V3 level), and a metal three layer (M3 level). The present disclosure contemplates multilayer interconnect MLI having more or less layers and/or levels, for example, a total number of N metal layers (levels) of the multilayer interconnect MLI with N as an integer ranging from 2 to 10. Each level of multilayer interconnect MLI includes conductive features (e.g., metal lines, metal vias, and/or metal contacts) disposed in one or more dielectric layers (e.g., an interlayer dielectric (ILD) layer and a contact etch stop layer (CESL)). In some embodiments, conductive features at a same level of multilayer interconnect MLI, such as M1 level, are formed simultaneously. In some embodiments, conductive features at a same level of multilayer interconnect MLI have top surfaces that are substantially planar with one another and/or bottom surfaces that are substantially planar with one another. CO level includes source/drain contacts (MD) disposed in a dielectric layer 28; V0 level includes gate vias VG, source/drain contact vias VD, and butted contacts disposed in the dielectric layer 28; M0 level includes M0 metal lines disposed in dielectric layer 28, where gate vias VG connect gate structures to M0 metal lines, source/drain vias V0 connect source/drains to M0 metal lines, and butted contacts connect gate structures and source/drains together and to M0 metal lines; V1 level includes V1 vias disposed in the dielectric layer 28, where V1 vias connect M0 metal lines to M1 metal lines; M1 level includes M1 metal lines disposed in the dielectric layer 28; V2 level includes V2 vias disposed in the dielectric layer 28, where V2 vias connect M1 lines to M2 lines; M2 level includes M2 metal lines disposed in the dielectric layer 28; V3 level includes V3 vias disposed in the dielectric layer 28, where V3 vias connect M2 lines to M3 lines. FIG. 2 has been simplified for the sake of clarity to better understand the inventive concepts of the present disclosure. Additional features can be added in the various layers of the memory, and some of the features described can be replaced, modified, or eliminated in other embodiments of the memory. FIG. 2 is merely an example and may not reflect an actual cross-sectional view of the IC device 10 and/or SRAM cell 100 that is discussed in further detail below.

Figure 3:
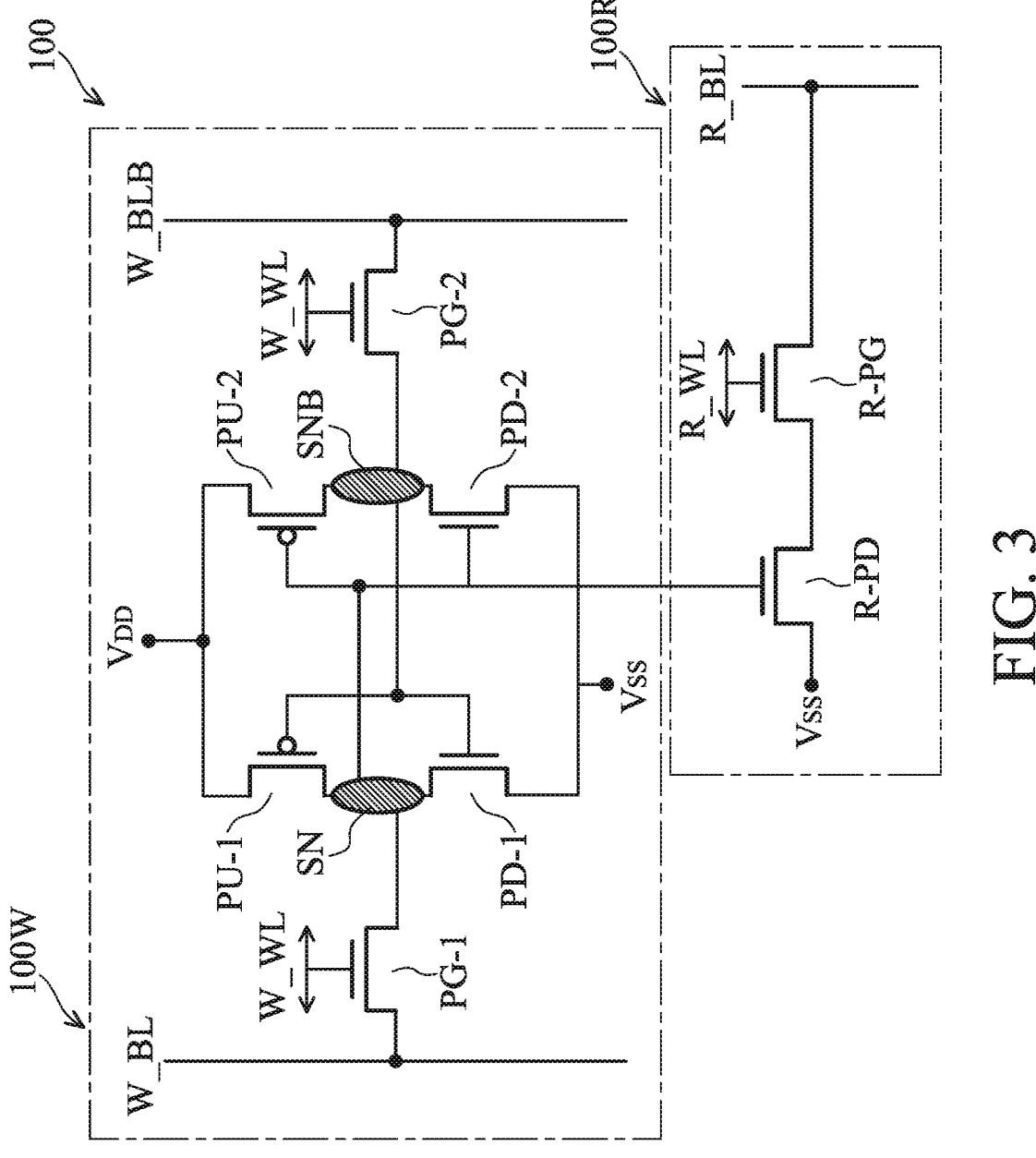
FIG. 3 illustrates a circuit schematic for a two-port static random-access memory (SRAM) cell, in accordance with some embodiments of the present disclosure.

Referring now to FIG. 3, an example circuit schematic for a two-port SRAM cell 100 is shown. The two-port SRAM cell 100 includes a write-port 100W and a read-port 100R. The write-port 100W includes pull-up transistors PU-1, PU-2, pull-down transistors PD-1, PD-2, and pass-gate transistors PG-1, PG-2. In the illustrated embodiment, transistors PU-1 and PU-2 are p-type transistors, and transistors PG-1, PG-2, PD-1, and PD-2 are n-type transistors.

The drains of the pull-up transistor PU-1 and the pull-down transistor PD-1 are coupled together, and the drains of the pull-up transistor PU-2 and the pull-down transistor PD-2 are coupled together. The transistors PU-1 and PD-1 are cross-coupled with the transistors PU-2 and PD-2 to form a data latch. The gates of the transistors PU-2 and PD-2 are coupled together and to the common drains of the transistors PU-1 and PD-1 to form a storage node SN, and the gates of the transistors PU-1 and PD-1 are coupled together and to the common drains of the transistors PU-2 and PD-2 to form a complementary storage node SNB. Sources of the pull-up transistors PU-1 and PU-2 are coupled to a power voltage Vdd (also referred to as Vcc), and the sources of the pull-down transistors PD-1 and PD-2 are coupled to a voltage Vss, which may be an electrical ground in some embodiments.

The storage node SN of the data latch is coupled to a bit line W_BL of the write-port 100W through the pass-gate transistor PG-1, and the complementary storage node SNB is coupled to a complementary bit line W_BLB of the write-port 100W through the pass-gate transistor PG-2. The storage node SN and the complementary storage node SNB are complementary nodes that are often at opposite logic levels (logic high or logic low). Gates of the pass-gate transistors PG-1 and PG-2 are coupled to a word line W_WL of the write-port 100W.

The read-port 100R of the SRAM cell 100 includes a read-port pass-gate transistor (R-PG) and a read-port pull-down transistor (R-PD). The gate of the read-port pass-gate transistor R-PG is coupled to a word line R_WL of the read-port. The gate of the read-port pull-down transistor R-PD is coupled to the storage node SN (or to the gates of the transistors PU-2 and PD-2). The read-port transistors R-PG and R-PD are coupled between the bit line R_BL of the read-port and Vss.

According to the various aspects of the present disclosure, the transistor R-PD and R-PG of the read-port are implemented to have wider channel widths than all the transistors of the write-port. Even within the write-port, the transistors PU-1 and PU-2 are implemented to have narrower channel widths than the transistors PD-1, PD-2, PG-1, and PG-2. In some embodiments, the transistors R-PD, PD-2, and PU-2 may share a continuous gate structure, but they are implemented with different work function metals for their respective gate electrodes, and/or with different gate dielectrics (e.g., doped v.s. non-doped gate dielectric). Such configurations help to optimize the performance of the two-port SRAM cell 100, for example by increasing reading and/or writing speed while reducing parasitic capacitance or leakage.

Figure 4:
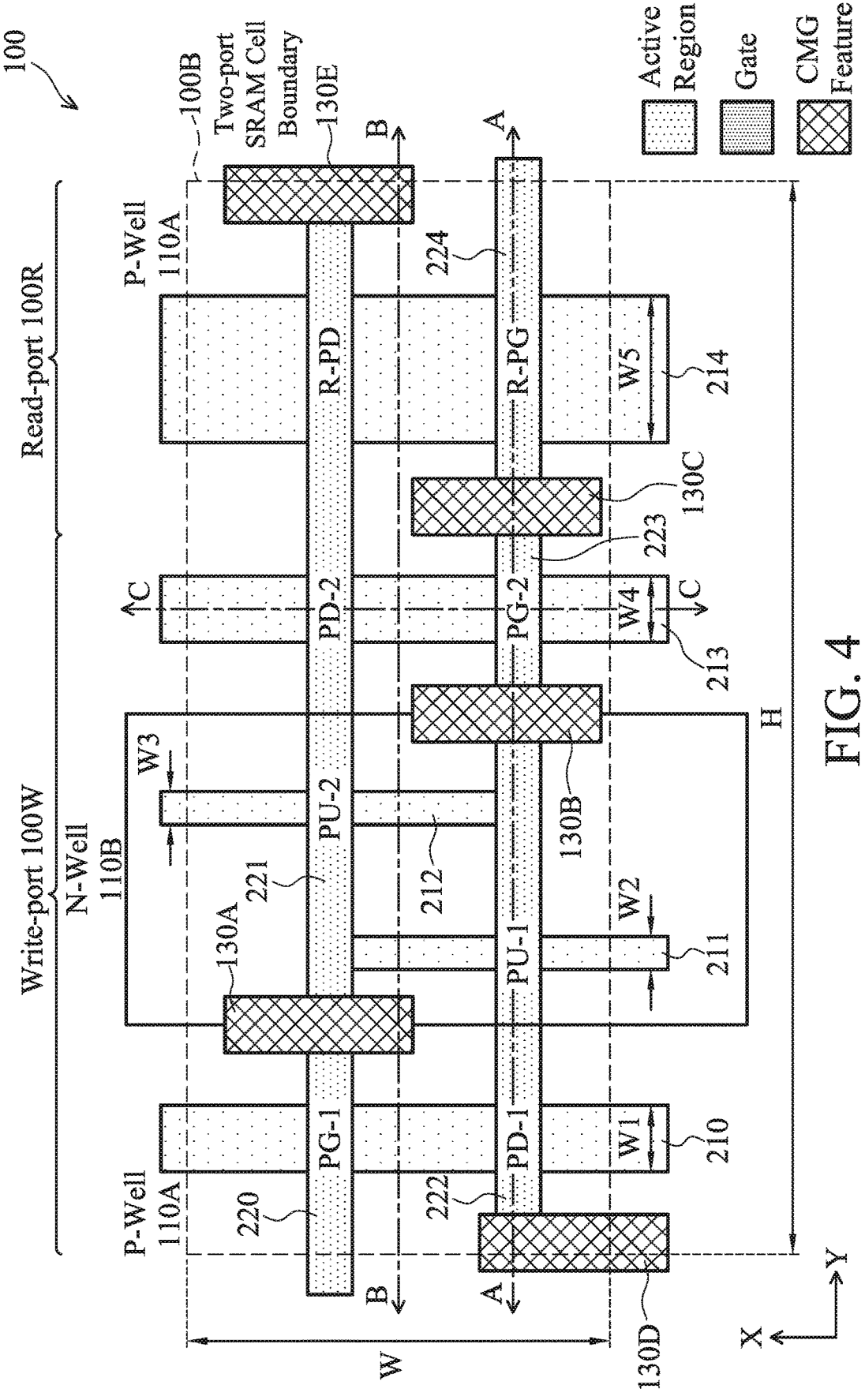
FIG. 4 illustrates a top view of the device layer of the two-port SRAM cell as in FIG. 3, in accordance with some embodiments of the present disclosure.

FIG. 4 illustrates a simplified diagrammatic top view of the two-port SRAM cell 100, which includes the write-port 100W and the read-port 100R. The write-port 100W includes the transistors PG-1, PG-2, PU-1, PU-2, PD-1, and PD-2. The read-port 100R includes the transistors R_PD and R_PG. For reasons of visual clarity and simplicity, well regions, active regions, gate structures, and gate-cut features of these transistors are shown in FIG. 4, but the interconnection components such as contacts, vias, and metal lines are omitted from FIG. 4.

In the illustrated embodiment, the transistors in the SRAM cell 100 are implemented as Gate-All-Around (GAA) transistors. Although FinFETs may be used to implement SRAM devices, FinFETs may run into problems as the SRAM devices are continuously scaled down into ever-smaller sizes. For example, SRAM devices implemented using FinFETs may be more prone to cell mismatch issues, which may adversely affect the stability of SRAM devices. To address the issues related to the FinFET devices, the present disclosure utilizes multi-channel devices such as Gate-All-Around (GAA) transistors to implement the SRAM devices. Compared to FinFETs or planar transistors, GAA transistors allow for more flexible channel scaling as well as lower standby leakage due to better drain-induced-barrier-lowering (DIBL) and swing performance.

As shown in FIG. 4, the two-port SRAM cell 100 includes active regions 210, 211, 212, 213, and 214. The active regions 210-214 each extend lengthwise in the X-direction in FIG. 4. In the illustrated embodiment, the active regions 210-214 may each include (or may be implemented as) the nanostructures 26 of FIG. 2 discussed above. The active regions 210-213 are components of the write-port 100W, and the active region 214 is a component of the read-port 100R. In the illustrated embodiment, the active regions 211, 212 belong to the transistors PU-1 and PU-2, respectively, which are PMOS devices. As such, the active regions 211, 212 are formed over an n-well 110B. Meanwhile, the active region 210 belongs to the transistors PD-1 and PG-1, which are NMOS devices. As such, the active region 210 is formed over a p-well 110A (or a p-type substrate). Similarly, the active regions 213, 214 belong to the transistors PG-2. PD-2, R-PG, and R-PD, which are NMOS devices. As such, the active regions 213, 214 are formed over a p-well 110A (or a P-type substrate). The p-wells 110A and n-wells 110B are interleaved with each other along the Y-direction in an SRAM array.

As shown in FIG. 4, the two-port SRAM cell 100 further includes gate structures 220, 221, 222, 223, and 224. The gate structures 220-224 each extend lengthwise in the Y-direction in FIG. 4. Each of the gate structures 220-224 has a critical dimension (CD) or gate width (denoted as G), which is the width measured along the Y-direction. The gate structures 220-224 may each include (or may be implemented as) the gate structures 20 of FIG. 2 discussed above. The gate structures 220, 222, and 223 are components of the write-port 100W. The gate structure 224 is a component of the read-port 100R. The gate structure 221 extends through both the write-port 100W and the read-port 100R. As such, a portion of the gate structure 221 is a component of the write-port 100W, and another portion of the gate structure 221 is a component of the read-port 100R. In other words, the gate structure 221 is shared by the transistor R_PD of the read-port 100R and the transistors PU-2 and PD-2 of the write-port 100W.

Different active regions in different transistors of the SRAM cell 200 may have different widths (e.g., dimensions measured in the Y-direction) in order to optimize device performance. In more detail, the active region 210 of the PD-1 transistor and the PG-1 transistor has a width W1, the active region 211 of the PU-1 transistor has a width W2, the active region 212 of the PU-2 transistor has a width W3, the active region 213 of the PG-2 transistor and the PD-2 transistor has a width W4, and the active region 214 of the R-PG transistor and the R-PD transistor has a width W5. The widths W1-W5 are measured in the portions of the respective active regions underneath the gate structures 220-224. In other words, these portions of the active regions (from which the widths W1-W5 are measured) are the channel regions (e.g., the vertically-stacked nanostructures of GAA devices) of the transistors. To optimize SRAM performance, the width W5 is configured to be equal or greater than W1-W4 in order to improve read speed of the SRAM cell 100, the widths W2 and W3 are configured to be smaller than the widths W1 and W4 in order to balance the speed among the PMOS devices and the NMOS devices. Further, the widths W2 and W3 may be the same, and the widths W1 and W4 may be the same, in some embodiments. Alternatively, the widths W2 and W3 may be different, and the widths W1 and W4 may be different, in some embodiments, to balance the asymmetric layout due to the existence of the read-port 100R on a single side of the write-port 100W. In furtherance of some alternative embodiments, the widths W2 may be larger than W3 but smaller than either of the widths W1 and W4, and the width W1 may be larger than W4.

In some embodiments, a ratio of the width W5 and the gate width G is in a range between about 0.5:1 to about 5:1, a ratio of the width W1 (or W4) and the gate width G is in a range between about 0.5:1 to about 5:1, and a ratio of the width W2 (or W3) and the gate width G is in a range between about 0.3:1 to about 3:1. Such ranges are not arbitrarily chosen but rather specifically configured to sufficiently improve the speed of the read-port 100R and balance the speeds between the read-port 100R and the write-port 100W without increasing the footprint of the overall device or raising electrical shorting risks, or causing undue manufacturing difficulties. Further, using GAA transistors allows the active region widths to be more flexibly chosen; as a comparison, using FinFET transistors restricts the active region widths to discrete values, specifically integer multiples of a single fin width.

Still referring to FIG. 4, the two-port SRAM cell 100 further includes a plurality of gate-cut features extending lengthwise along the X-direction, including dielectric features 130A, 130B, 130C, 130D, 130E (collectively, dielectric features 130). In the illustrated embodiment, the dielectric feature 130A is disposed between the active regions 210, 211 and abuts the gate structure 220 and the gate structure 221. The dielectric feature 130A divides an otherwise continuous gate structure line into two isolated segments corresponding to the gate structure 220 and the gate structure 221. Similarly, the dielectric feature 130B is disposed between the active regions 212, 213 and abuts the gate structure 222 and the gate structure 223, and the dielectric feature 130C is disposed between the active regions 223, 224 and abuts the gate structure 223 and the gate structure 224. The dielectric feature 130B and the dielectric features 130C divide an otherwise continuous gate structure line into three isolated segments corresponding to the gate structure 222, the gate structure 223, and the gate structure 224. The dielectric features 130D, 130E are disposed on edges of the SRAM cell 100 to separate the gate structures from adjacent SRAM cells. Each of the dielectric features 130 is formed by filling a corresponding cut-metal-gate (CMG) trench in the position of the dielectric features. The dielectric features 130 are also referred to as CMG features. In the illustrated embodiment, the dielectric features 130A, 130B are disposed above an interface between the p-well 100A and the n-well 110B. The dielectric features 130C, 130D, 130E are disposed fully within the p-well 110A.

A CMG process refers to a fabrication process where after a metal gate (e.g., a high-k metal gate or HKMG) replaces a dummy gate structure (e.g., a polysilicon gate), the metal gate is cut (e.g., by an etching process) to separate the metal gate into two or more gate segments. Each gate segment functions as a metal gate for an individual transistor. An isolation material is subsequently filled into trenches between adjacent portions of the metal gate. These trenches are referred to as cut-metal-gate trenches, or CMG trenches, in the present disclosure. The dielectric material filling a CMG trench for isolation is referred to as a CMG feature. To ensure a metal gate would be completely cut, a CMG feature often further extends into adjacent areas, such as dielectric layers filling space between the metal gates. A CMG feature often have an elongated shape in a top view.

Still referring to FIG. 4, a boundary 100B of the two-port SRAM cell 100 is illustrated in FIG. 4 using broken lines. Note that some of the active regions and gate structures may extend beyond the illustrated boundary 100B, since these active regions and gate structures may also form components of other adjacently located SRAM cells as well. The boundary 100B is longer in the Y-direction than in the X-direction, for example about 3.5 times to about 6 times longer. In other words, the boundary 100B may be rectangular. The first dimension of the boundary 100B along the X-direction is denoted as a cell width W, and the second dimension of the boundary 100B along the Y-direction is denoted as a cell height H. Where the two-port SRAM cell 100 is repeated in a memory array, the cell width W may represent and be referred to as a memory cell pitch in the memory array along the X-direction, and the cell height H may represent and be referred to as a memory cell pitch in the memory array along the Y-direction.

Figure 5:
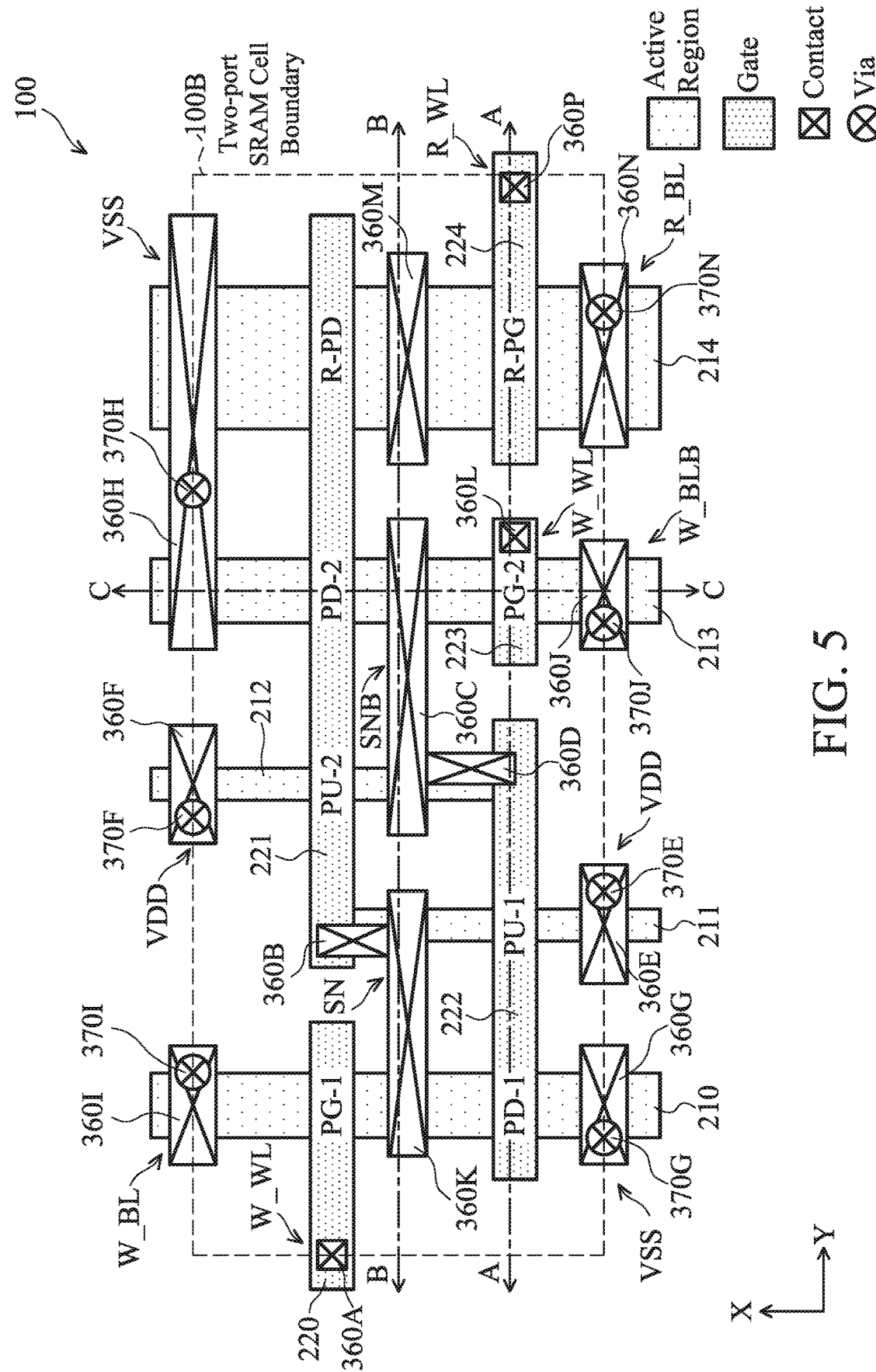
FIG. 5 illustrates a top view of the interconnect structures of the two-port SRAM cell as in FIG. 3, in accordance with some embodiments of the present disclosure.

FIG. 5 illustrates conductive features of the two-port SRAM cell 100 in the contact level and the V0 level. To aid visual clarity, the active regions 210-214, the gate structures 220-224, and the cell boundary 100B illustrated in FIG. 4 are reproduced in FIG. 5, while numerous other features are omitted from FIG. 5 for reasons of simplicity.

A gate contact 360A electrically connects a gate of the pass-gate transistor PG-1 (formed by gate structure 220) to a write-port word line W_WL, and a gate contact 360L electrically connects a gate of the pass-gate transistor PG-2 (formed by gate structure 223) to the write-port word line W_WL. An S/D contact 360K electrically connects a drain region of the pull-down transistor PD-1 (formed on the active region 210 (which may include n-type epitaxial source/drain features)) and a drain region of the pull-up transistor PU-1 (formed on the active region 211 (which may include p-type epitaxial source/drain features)), such that a common drain of pull-down transistor PD-1 and pull-up transistor PU-1 form a storage node SN. A gate contact 360B electrically connects a gate of the pull-up transistor PU-2 (formed by gate structure 221) and a gate of the pull-down transistor PD-2 (also formed by gate structure 221) to the storage node SN. The gate contact 360B may be a butted contact abutting the S/D contact 360K. An S/D contact 360C electrically connects a drain region of the pull-down transistor PD-2 (formed on the active region 213 (which may include n-type epitaxial source/drain features)) and a drain region of the pull-up transistor PU-2 (formed on the active region 212 (which may include p-type epitaxial source/drain features)), such that a common drain of pull-down transistor PD-2 and pull-up transistor PU-2 form a complementary storage node SNB. A gate contact 360D electrically connects a gate of the pull-up transistor PU-1 (formed by the gate structure 222) and a gate of the pull-down transistor PD-1

(also formed by the gate structure 222) to the complementary storage node SNB. The gate contact 360D may be a butted contact abutting the S/D contact 360C. A gate contact 360P electrically connects a gate of the read-port pass-gate transistor R-PG (formed by the gate structure 224) to the read-port word line R_WL.

An S/D contact 360E and an S/D contact via 370E landing thereon electrically connect a source region of pull-up transistor PU-1 (formed on the active region 211 (which can include p-type epitaxial source/drain features)) to a power supply voltage VDD. An S/D contact 360F and an S/D contact via 370F landing thereon electrically connect a source region of the pull-up transistor PU-2 (formed on the active region 212 (which may include p-type epitaxial source/drain features)) to the power supply voltage VDD. An S/D contact 360G and an S/D contact via 370G landing thereon electrically connect a source region of the pull-down transistor PD-1 (formed on the active region 210 (which may include n-type epitaxial source/drain features)) to an electric ground VSS. An S/D contact 360H and an S/D contact via 370H landing thereon electrically connect a source region of the pull-down transistor PD-2 (formed on the active region 213 (which may include n-type epitaxial source/drain features)) and a source region of the read-port pull-down transistor R-PD (formed on the active region 214 (which may include n-type epitaxial source/drain features)) to the electric ground VSS. The S/D contact 360G and the S/D contact 360H may be device-level contacts that are shared by adjacent SRAM cells 100 (e.g., four SRAM bit cells 100 abutting at a same corner may share one S/D contact 360H). An S/D contact 360I and an S/D contact via 370I landing thereon electrically connect a source region of the pass-gate transistor PG-1 (formed on the active region 210 (which may include n-type epitaxial source/drain features)) to a write-port bit line W_BL. An S/D contact 360J and an S/D contact via 370J landing thereon electrically connect a source region of the pass-gate transistor PG-2 (formed on the active region 213 (which may include n-type epitaxial source/drain features)) to a write-port complementary bit line W_BLB. A dummy contact 360M is formed over the drain region of the read-port pull down transistor R-PD (formed on the active region 214 (which may include n-type epitaxial source/drain features)). The dummy contact 360M is electrically floating. An S/D contact 360N and an S/D contact via 370N landing thereon electrically connect a source region of the read-port pass-gate transistor R-PG to the read-port bit line R_BL.

Figure 6:
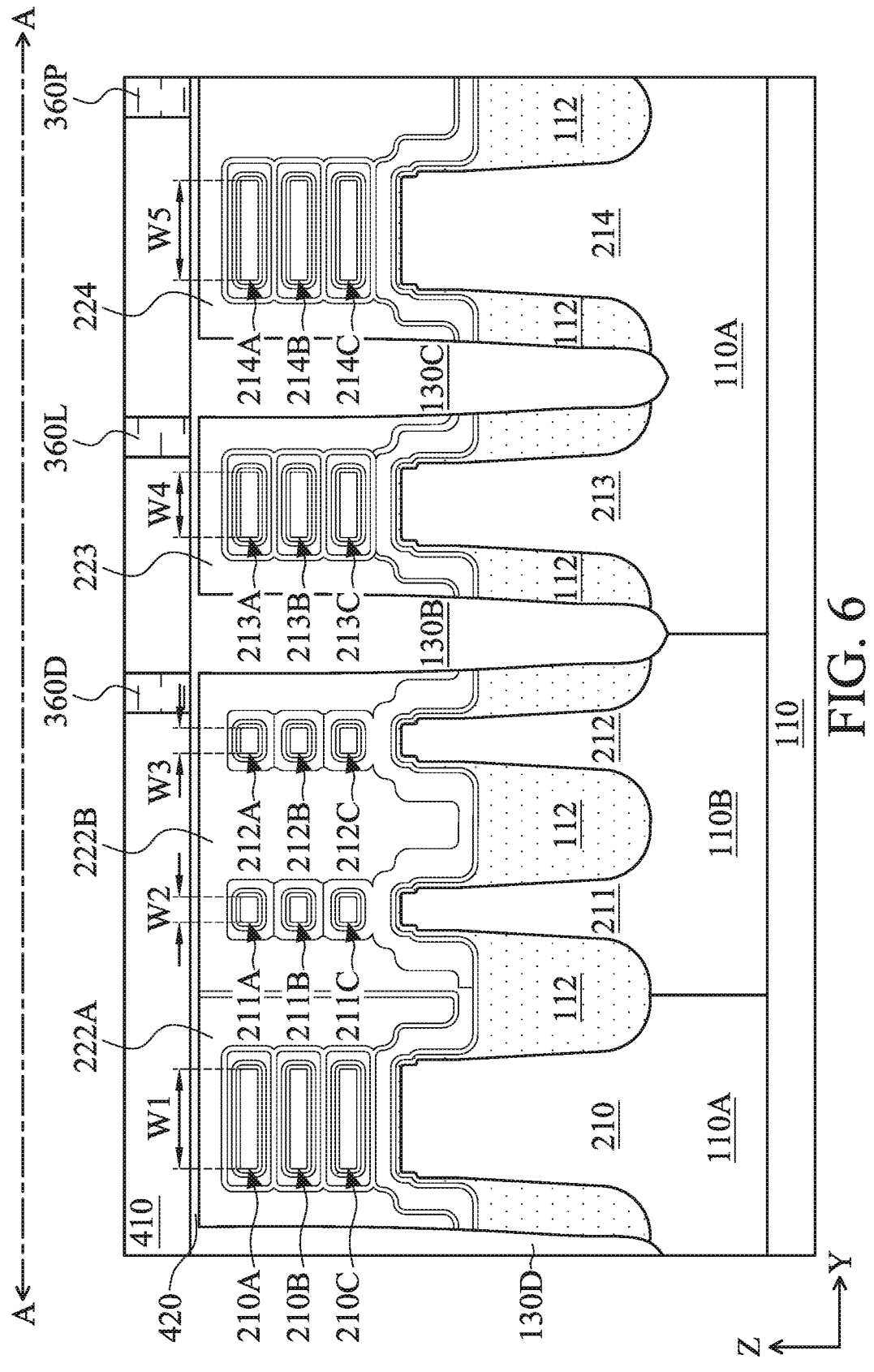
FIGS. 6, 7, and 8 illustrate cross-sectional views of portions of the two-port SRAM cell as in FIGS. 4 and 5, in accordance with some embodiments of the present disclosure.
Figure 7:
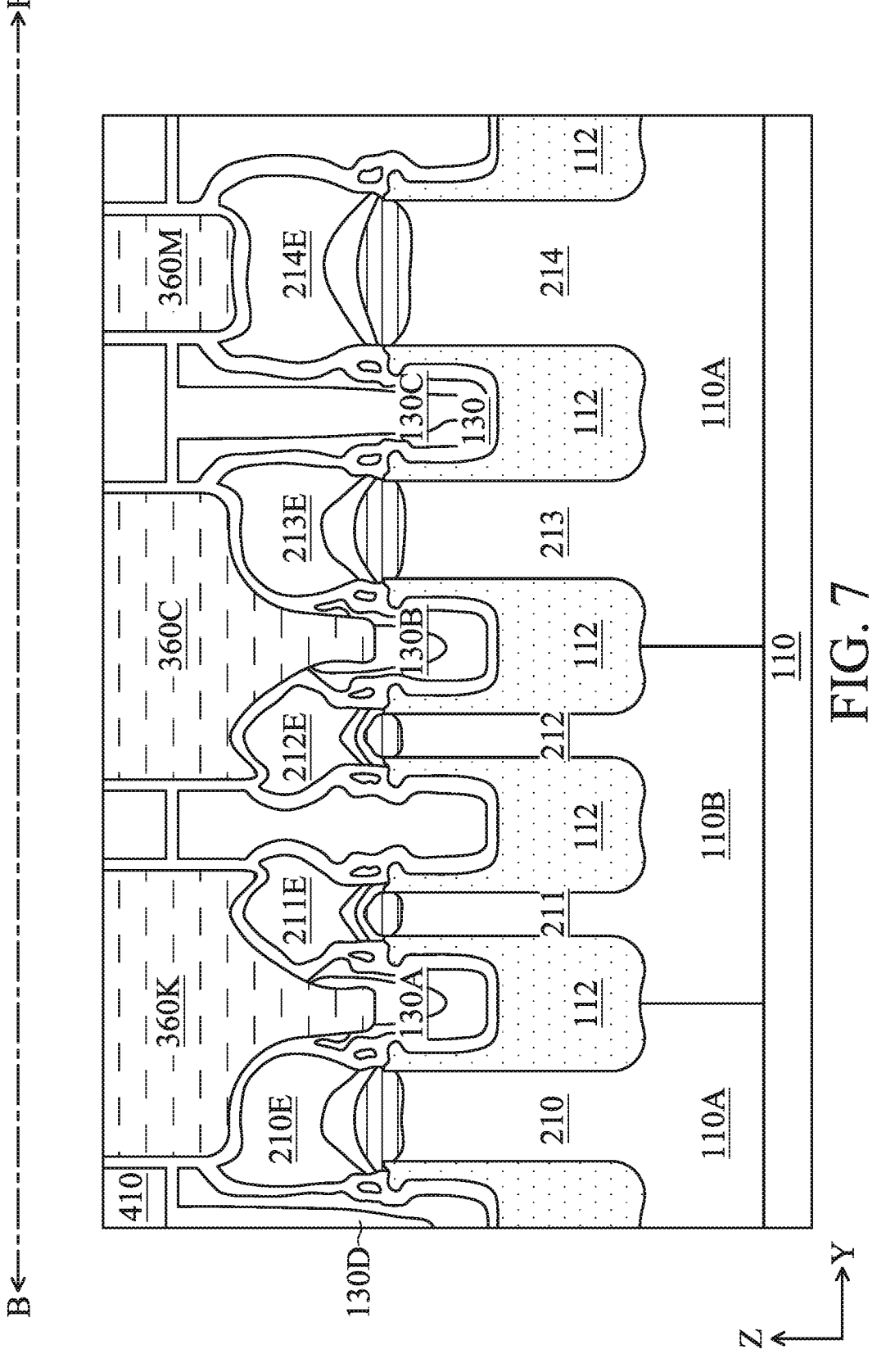
Figure 8:
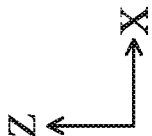

To further illustrate the aspects of the present disclosure discussed above, various cross-sectional views of the two-port SRAM cell 100 are shown in FIGS. 6, 7, and 8. These cross-sectional views are taken at different cross-sections of the top views of the two-port SRAM cell 100 of FIGS. 4 and 5. In more detail, FIG. 6 corresponds to a cross-sectional view taken along a cutline A-A of FIGS. 4 and 5. FIG. 7 corresponds to a cross-sectional view taken along a cutline B-B of FIGS. 4 and 5. FIG. 8 corresponds to a cross-sectional view taken along a cutline C-C of FIGS. 4 and 5.

Referring now to FIG. 6, the two-port SRAM cell 100 includes a substrate, p-wells 110A and an n-well 100B formed over the substrate 110 (e.g., by doping the different portions of the substrate 110), and active regions 210-214 formed over the p-well 110A and the n-well 110B. The lower segments (e.g., the fin-shape structures) of the active regions 210-214 are separated from one another in the Y-direction by the isolation structure 112, for example a shallow trench isolation (STI). The upper portions of the active regions 210-214 are implemented as nano-structures 210A-210C, 211A-211C, 212A-212C, 213A-213C, and 214A-214C, respectively, such as nano-sheets, nano-tubes, nano-wires, etc. These nano-structures serve as vertically-stacked conductive channels of their respective transistors. For example, the nano-structures 210A-210C serve as the channels of the transistor PD-1, the nano-structures 211A-211C serve as the channels of the transistor PU-1, the nano-structures 212A-212C serve as the channels of the transistor PU-2, the nano-structures 213A-213C serve as the channels of the transistor PG-2, and the nano-structures 214A-214C serve as the channels of the transistor R_PG. Note that each vertical stack of the gate structures shown in FIG. 6 has three nano-structures (e.g., 210A disposed over 210B, which is disposed over 210C), but this is merely for reasons of simplicity. In other embodiments, each vertical stack of nano-structures may include a different number of nano-structures, for example two, four, or five.

The nano-structures 210A-210C of the transistor PD-1 each have the channel width W1, the nano-structures 211A-211C of the transistor PU-1 each have the channel width W2, the nano-structures 212A-212C of the transistor PU-2 each have the channel width W3, the nano-structures 213A-213C of the transistor PG-2 each have the channel width W4, and the nano-structures 214A-214C of the transistor R_PG each have the channel width W5. These channel widths W1-W5 are each measured in the Y-direction. As discussed above with reference to FIG. 4, in order to optimize the performance of the two-port SRAM cell 100, the channel widths W1 and W4 are greater than the channel widths W2 and W3, for example by about 1.5 time and about 5 times. In comparison, the channel widths W1 and W4 are approximately equal to one another, and the channel widths W2 and W3 are approximately equal to one another. Further, the channel widths W5 may be greater than the channel widths W1 and W4, for example by about 1.1 times and about 3 times.

The nano-structures 210A-210C are circumferentially surrounded by the gate structure 222A (as a first portion of the gate structure 222 of the transistor PD-1), and the nano-structures 211A-211C and 212A-212C are circumferentially surrounded by the gate structure 222B (as a second portion of the gate structure 222 of the transistor PU-1). Meanwhile, the nano-structures 213A-213C are circumferentially surrounded by the gate structure 223 of the transistor PG-2, and the nano-structures 214A-214C are circumferentially surrounded by the gate structure 224 of the transistor R_PG. The gate structures 222, 223, and 224 are also isolated from each other by gate-cut features 130. In the illustrated embodiment, in the channel regions, the gate-cut features 130B, 130C, 130D each may extend downward through the STI features 112 to ensure a sufficient isolation.

In some embodiments, the gate structure 222A and the gate structure 223 each have a first WF metal, the gate structure 224 has a second WF metal different from the first WF metal, and the gate structure 222B has a third WF metal different from the first WF metal and different from the second WF metal. In some embodiments, the first WF metal and the second WF metal each contains TiN, TaN, WCN, TiAl, W, or combinations thereof. However, the first WF metal has a thicker TiN and/or a thicker WCN than the second WF metal. The implementation of different WF metals for different gate structures allows for different threshold voltages (Vt) to be tuned for these different gate structures. This facilitates further optimization of the SRAM performance, since it allows the writing speed of the write-port 100W to be increased while reducing (or at least not increasing) the leakage of the read-port 100R.

Gate contacts 360L and 360P are formed over the gate structures 223 and 224, respectively. The butted contact 360D is formed over the gate structure 222B. The gate contacts 360L, 360P and the butted contact 360D help provide electrical connectivity between the gate structures 222-224 and other components of the two-port SRAM cell 100 and/or with external devices. The gate contacts 360L, 360P and the butted contact 360D are electrically and physically separated from one another by an interlayer dielectric (ILD) 410, which is formed over the gate structures 222-224. Note that in some embodiments, such as in the embodiment illustrated herein, a gate-top dielectric layer 420 may be formed over the gate structures 222-224. In that case, ILD 410 may be formed over the gate-top dielectric layer 420.

Referring now to FIG. 7, the cross-sectional view (corresponding to the cutline C-C) shown herein shares various similarities with the cross-sectional view of FIG. 6 discussed above. Therefore, similar components appearing in FIGS. 6 and 7 will be labeled the same, and their detailed discussions may not be repeated hereinafter. Unlike FIG. 6, the cutline C-C of FIG. 7 is taken outside the gate structures and do not intersect the nano-structures (i.e., the channels of GAA transistors). Instead, the cutline C-C intersects a plurality of source/drain features 210E-214E that are epitaxially grown on the active regions 210-214, respectively. The source/drain features 210E, 213E, and 215E are n-type source/drain features, while the source/drain features 211E and 212E are p-type source/drain features. The source/drain features 210E-215E are also electrically and physically separated from one another by the ILD 410. The source/drain contact 360K is formed over, and electrically couples together, the source/drain features 210E and 211E. The source/drain contact 360C is formed over, and electrically couples together, the source/drain features 212E and 213E. The dummy source/drain contact 360M is formed over the source/drain feature 214E. In the illustrated embodiment, outside the gate structures, the gate-cut features 130 (e.g., 130A, 130B, 130C, 130D) each may extend downward below a top surface of the STI features 112 but does not extend through the STI features 112. This is mainly due to that during the formation of CMG trenches the etching rate in the source/drain region is less than in the channel region. Therefore, the gate-cut features 130 each have a larger depth in the channel region and a shallower depth outside of the gate structures.

Referring now to FIG. 8, the gate structure 221 (of the transistor PD-2) and the gate structure 223 (of the transistor PG-2) are shown as being formed over the p-well 110A. The gate structure 221 includes a plurality of gate electrode components 441 and a plurality of gate dielectric components 451. The gate structure 223 includes a plurality of gate electrode components 443 and a plurality of gate dielectric components 453. The gate dielectric components 451 surround or wrap around the respective nano-structures 213A-213C of the active region 213. The gate dielectric components 453 surround or wrap around the respective nano-structures 213A-213C of the active region 213. The gate electrode components 441 and 443 each have the first WF metal. Source/drain features 213E are disposed on opposite sides of the gate structure 221 and on opposite sides of the gate structure 223. Gate spacers 470 are also formed on the sidewalls of the portion of the gate structures 221 and 223 above the upper surfaces of source/drain features 213E. Inner spacers 480 are formed on portions of the gate structures 221 and 223 below the upper surfaces of source/drain features 213E. The gate top dielectric layer 420 is formed above the gate structures 221 and 223. The ILD 410 is formed above the gate top dielectric layer 420.

The source/drain contacts 360H, 360C, and 360J are formed on the source/drain features 213E. The source/drain contact via 370J electrically connects the source/drain contact 369J to the write-port complimentary bit line (W_BLB). The source/drain contacts 360H, 360C, 360J and source/drain contact via 370J are formed on a frontside of the semiconductor device, which are also referred to as frontside source/drain contacts and frontside via. FIG. 8 also depicts a backside via or backside contact 360HB. The backside contact 360HB electrically connects a backside of the respective source/drain feature 213E to the electric ground (VSS).

Figure 9:
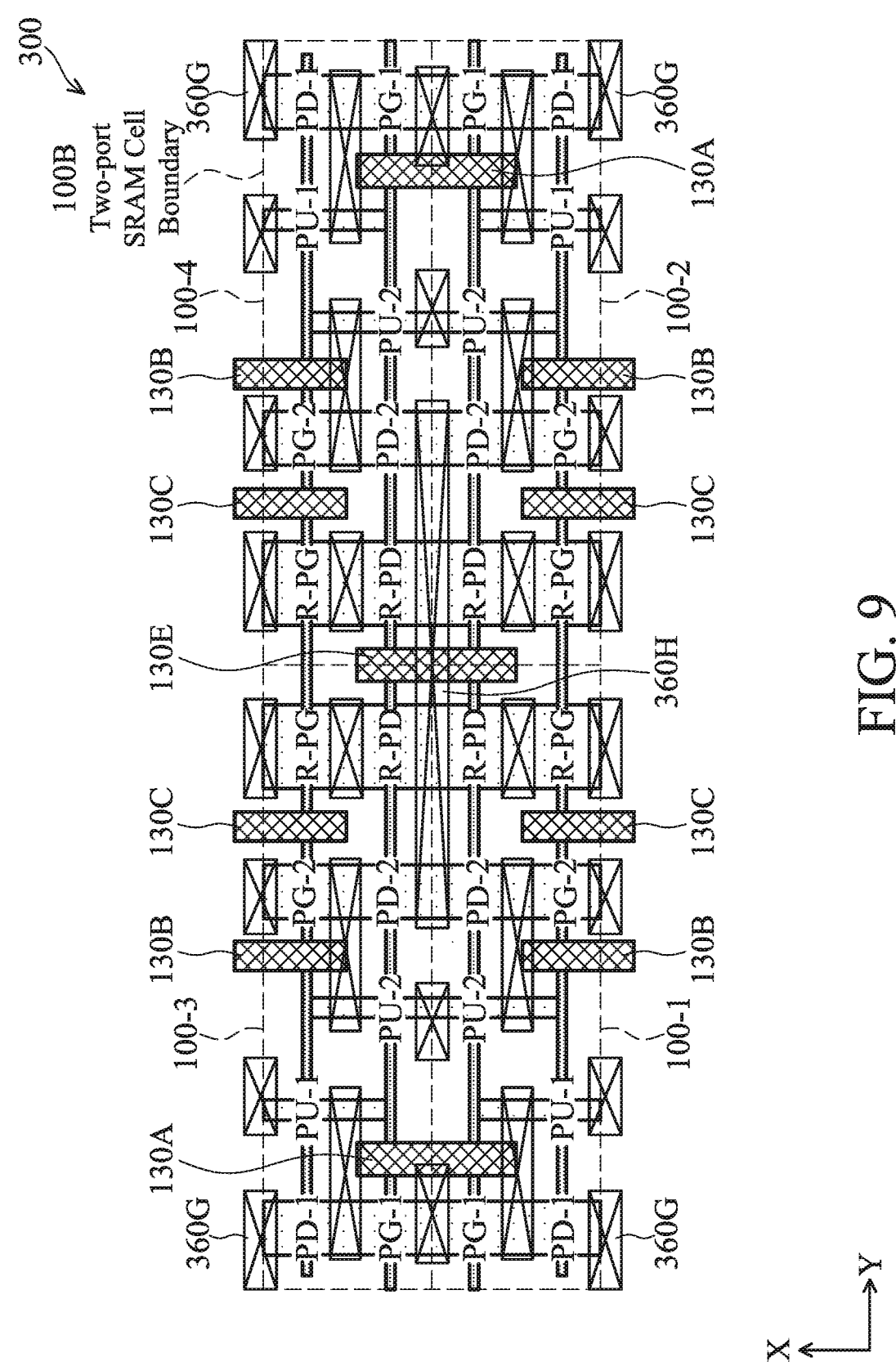
FIG. 9 is a top view of a layout of a 2×2 memory array tiled by the two-port SRAM cell as in FIGS. 4 and 5, in accordance with some embodiments of the present disclosure.

FIG. 9 illustrates a top view (frontside view) of an array 300 of SRAM bit cells according to the present disclosure. Referring to FIG. 9, a plurality of SRAM bit cells 100-1, 100-2, 100-3, and 100-4 are arranged in the X-direction and the Y-direction, forming a 2×2 array of SRAM bit cells. Each SRAM bit cell in the array may use the layout of the SRAM bit cell 100 as depicted in FIGS. 4 and 5. In some embodiments, two adjacent SRAM bit cells in the X-direction are line symmetric with respect to a common boundary (represented by broken lines in FIG. 9) therebetween and two adjacent SRAM cells in the Y-direction are line symmetric with respect to a common boundary therebetween. That is, the SRAM cell 100-2 is a duplicate cell for the SRAM cell 100-1 but flipped over the X-axis; the SRAM cell 100-3 is a duplicate cell for the SRAM cell 100-1 but flipped over the Y-axis; and the SRAM cell 100-4 is a duplicate cell for the SRAM cell 100-2 but flipped over the Y-axis.

For case of reference, a column is referred to as being in the X-direction in this example. Thus, the SRAM bit cells 100-1, 100-3 are in a first column, and the SRAM bit cells 100-2, 100-4 are in a second column. As depicted above, adjacent cells in the array are mirror images along a common boundary between the adjacent cells. Some active regions in an SRAM cell may extend through multiple SRAM cells in a column. For example, the active region for the transistors PG-1 and PD-1 in the SRAM cell 100-1 extends through the SRAM cell 100-3 as the active region for its transistors PD-1 and PG-1. The active region for the transistor PU-2 in the SRAM cell 100-1 extends into the SRAM cell 100-3 as the active region for its transistor PU-2. The active region for the transistors PG-2 and PD-2 in the SRAM cell 100-1 extends into the SRAM cell 100-3 as the active region for its transistors PG-2 and PD-2. The active region for the transistors R-PG and R-PD in the SRAM cell 100-1 extends into the SRAM cell 100-3 as the active region for its transistors R-PG and R-PD. The active regions in the SRAM cells 100-2, 100-4 are similarly arranged as their counterparts in the SRAM cells 100-1, 100-3.

Similarly, some gate structures can extend longitudinally across multiple SRAM cells without being interrupted by gate-cut features, while some gate structures are divided into segments by gate-cut features (e.g., CMG features 130). The gate-cut features disposed at boundaries of the SRAM cells can also be shared by adjacent SRAM bit cells. In the illustrated embodiment, the CMG feature 130E extends longitudinally in the X-direction and into corner regions of the four SRAM cells 100-1, 100-2, 100-3, 100-4 and is shared by these four SRAM cells. The CMG features 130A, 130B, 130C extend longitudinally in the X-direction across the boundary between the adjacent SRAM cells in the same column and is shared by these two SRAM cells.

The contacts disposed at boundaries of the SRAM cells can also be shared by adjacent SRAM cells. In the illustrated embodiment, the S/D contact 360H extends into corners regions of the four SRAM cells 100-1, 100-2, 100-3, 100-4 and is shared by these four SRAM bit cells, therefore tying the VSS nodes of the four SRAM cells together. Along the Y-direction, the S/D contact 360H crosses over four active regions, namely the active region for the transistors PD-2 in the SRAM cells 100-1, 100-3, the active region for the transistors R-PD in the SRAM cells 100-1, 100-3, the active region for the transistors R-PD in the SRAM cells 100-2, 100-4, and the active region for the transistors PD-2 in the SRAM cells 100-2, 100-4. Similarly, the S/D contacts 360G are also devoted to the VSS nodes and also marked with numerals in FIG. 9. The S/D contacts 360G may also extend through the boundaries and be shared with four adjacent SRAM cells. The S/D contacts 360G may extend along the Y-direction and cross over two active regions both for transistors PD-1 in the adjacent SRAM cells.

Figure 10:
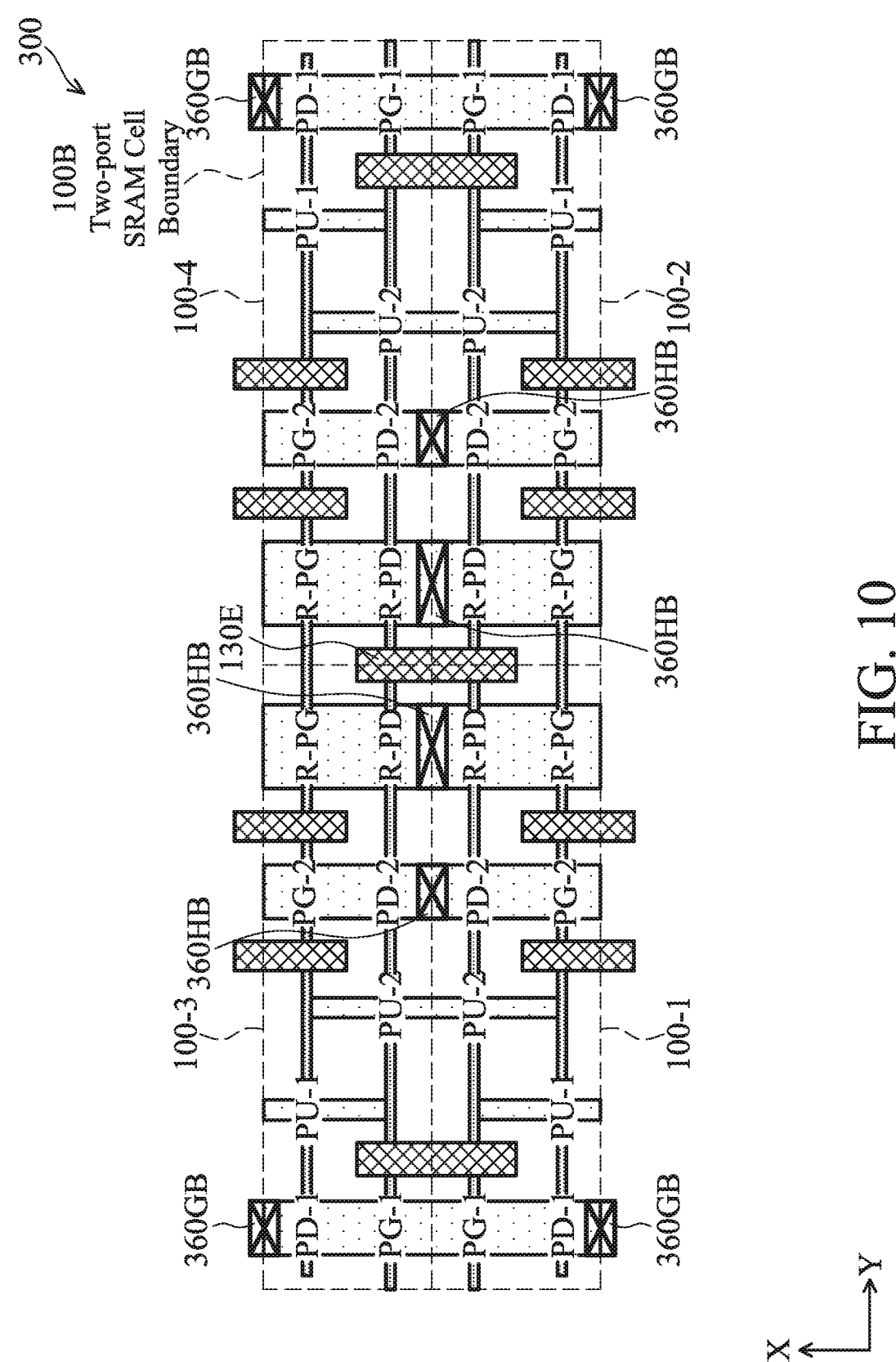
FIG. 10 is a backside view of a layout of a 2×2 memory array tiled by the two-port SRAM cell as in FIGS. 4 and 5, in accordance with some embodiments of the present disclosure.

FIG. 10 illustrates a bottom view (backside view) of the array 300 of SRAM bit cells according to the present disclosure. The power voltage lines (VDD and VSS) and signal lines are not necessarily all formed on the frontside of the integrated circuit structure but may be distributed on both the frontside and backside of the integrated circuit structure. For example, the integrated circuit structure may include a frontside interconnect structure and a backside interconnect structure disposed on the frontside and backside of the integrated circuit structure respectively and configured to connect various components of the pull-up devices, pull-down devices, and pass-gate devices to form the SRAM cells 100. The configuration is designed with considerations of various factors and parameters, including sizes of various conductive features, packing density, resistance of the conductive features, parasitic capacitances among adjacent conductive features, overlay shifting and processing margins. For example, if conductive features are too close, overlay shift may lead to short and leakage issues; the sizes of the conductive features are reduced, leading to increased resistances; the parasitic capacitances are increased as well; the processing margins are reduced; and so on. If the sizes of the conductive features are increased, the resistances of the conductive features are reduced but the spacing between the adjacent conductive features are decreased, leading to the increased parasitic capacitances, and reduced processing margins. If shielding conductive features are placed among adjacent conductive features, the parasitic capacitances are reduced. However, the packing density is reduced, and/or the resistances of the conductive features are increased. In the depicted embodiment, the grounding line VSS is formed on the frontside and the backside, and the power line VDD is formed on the frontside.

Still referring to FIG. 10, the backside S/D contacts (or referred to as backside vias) 360HB and 360GB as counterparts of the frontside S/D contacts 360H and 360G, respectively, are marked with numerals. Similar to the frontside S/D contacts 360H and 360G, the backside S/D contacts 360HB and 360GB are electrically coupled to the electric ground VSS. Different from the frontside counterparts, each of the backside S/D contacts 360HB and 360GB has a width along the Y-direction that is substantially the same as the width of the respective active region. This is due to one exemplary backside manufacturing flow in which the backside S/D contact is formed by etching the fin-shape structure in an active region from the backside to form a backside trench and filling the backside trench with conductive materials. Therefore, the backside S/D contact inherit the width of the active region. State differently, the frontside S/D contact 360G has a width larger than a width of the respective active region, while the backside S/D contact 360GB has a width substantially the same with the width of the respective active region. Similarly, the frontside S/D contact 360H crosses over four active regions, while there are four backside S/D contacts 360HB as its counterparts, with each having a width substantially the same as the respective active regions.

Figure 11:
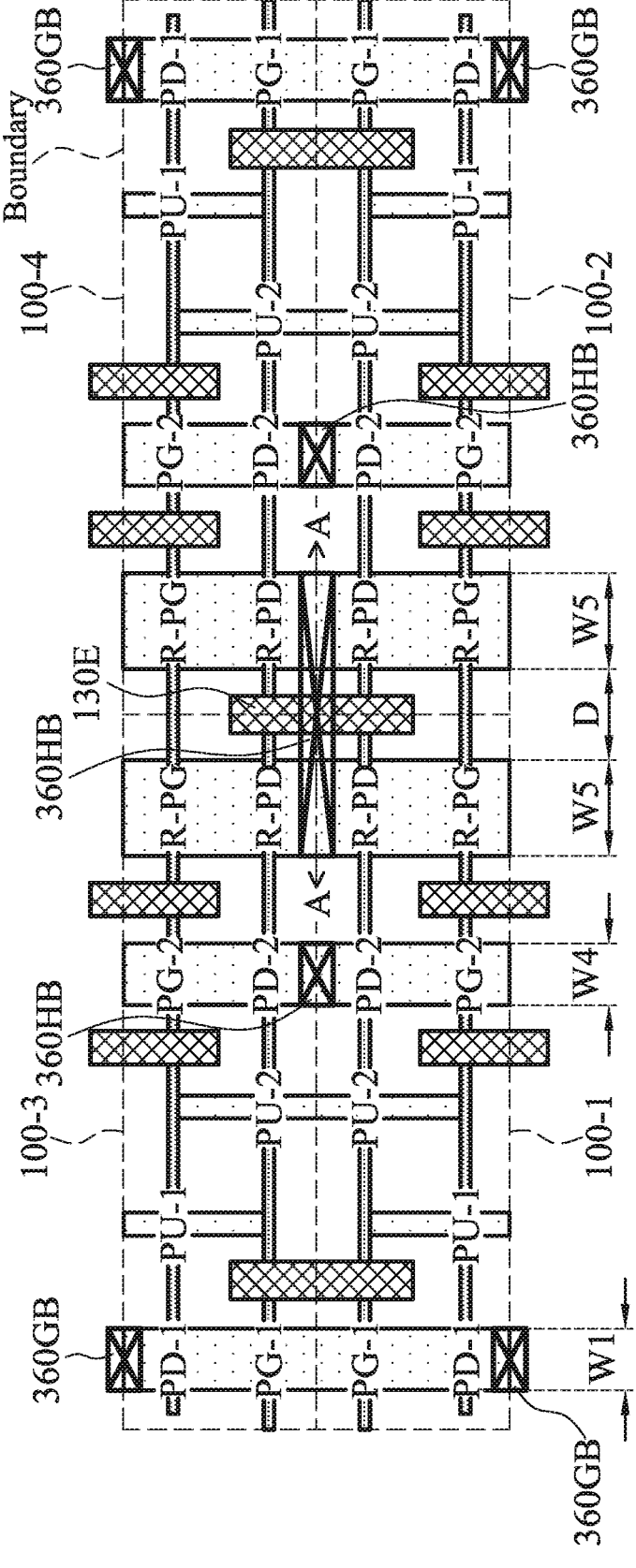
FIG. 11 is a backside view of a layout of a 2×2 memory array tiled by the two-port SRAM cell as in FIGS. 4 and 5, in accordance with some alternative embodiments of the present disclosure.

FIG. 11 illustrates an alternative embodiment of the bottom view (backside view) of the array 300 of SRAM bit cells according to the present disclosure. One difference between the embodiments in FIGS. 10 and 11 is that the middle two backside S/D contacts 360HB are merged together as one wider backside S/D contact 360HB in FIG. 11, while the two other backside S/D contacts 360HB on the sides remain the same. The middle backside S/D contact 360HB crosses over two active regions for the transistors R-PD and straddles the CMG feature 130E. Left edge of the middle backside S/D contact 360HB aligns with the left edge of the left one of the two active regions, and right edge of the middle backside S/D contact 360HB aligns with the right edge of the right one of the two active regions. Thus, the width of the middle backside S/D contact 360HB is 2*W5+D, in which W5 is the width of the active regions for transistors R-PD and D is the distance between the two active regions. As a comparison, the width of the other two backside S/D contacts 360HB is W4, which is the width of the active region for transistor PD-2, and the width of the backside S/D contacts 360GB is W1, which is the width of the active region for transistor PD-1.

With the ever-decreasing geometry size, the width (Cd) of the active regions has become so small such that the via holes consequently have a small opening and a large aspect ratio. The small opening and the large aspect ratio reduce the process window for filling conductive materials, which may lead to incomplete via formation and overlay error. Further, expanding the dimensions of the backside vias along the X-direction and/or the Y-direction may not be feasible, as the etching of an expanded via hole may also etch through dielectric layer between the via hole and the gate structures and cause metal gate protrusion and device malfunction. On the other hand, regarding the backside vias of the two middle backside S/D contacts 360HB in FIG. 10, the CMG feature 130E therebetween protects the adjacent gate structure and allows the backside vias to expand along the Y-direction without further risk of causing metal gate protrusion. Therefore, the otherwise two separated backside vias may form one continuous backside via straddling the CMG feature 130E. The resulting backside via (the middle backside S/D contact 360HB) has two leg portions filling the two via holes on two sides of the CMG feature 130E and a center portion expanding over the CMG feature 130E and connecting the two leg portions. It can also be considered as a conductive structure including a first backside via formed on the backside of the left active region, a second backside via formed on the backside of the right active region, and a conductive feature connecting the first and second backside vias and across the CMG feature 130E. The expanded opening and the reduced-aspect-ratio of via holes enlarge the process window, reduce difficulty of filling conductive material(s) in high-aspect-ratio via holes, and mitigate overlaying inaccuracy.

FIG. 12 illustrates a flow chart of a method 500 for fabricating a semiconductor device (or device) 600 that is substantially similar to or as a portion of the integrated circuit structure including the SRAM cell 100 as depicted in FIGS. 3-11 according to various embodiments of the present disclosure. Additional processing is contemplated by the present disclosure. Additional operations can be provided before, during, and after method 500, and some of the operations described can be moved, replaced, or eliminated for additional embodiments of method 500.

The method 500 is described below in conjunction with FIG. 13 through FIG. 21 that illustrate cross-sectional views of the semiconductor device 600 at various steps of fabrication according to the method 500, in accordance with some embodiments. The cross-sectional views of the device 600 in FIG. 13 through FIG. 21 are along the A-A line in FIG. 11 and illustrate the formation of, among other features, a backside via straddling a CMG feature in a source/drain region, which is substantially similar to the middle backside source/drain contact (or backside via) 360HB in FIG. 11. FIG. 13 through FIG. 21 have been simplified for the sake of clarity to better understand the inventive concepts of the present disclosure. Additional features can be added in the device 600, and some of the features described below can be replaced, modified, or eliminated in other embodiments of the device 600.

At operation 502, the method 500 (FIG. 12) provides the device 600 having a substrate 602 at its backside and various elements including transistors built on its frontside. These elements include an isolation structure 604 over the substrate 602, two semiconductor fins (or fins) 606 (e.g., corresponding to the fin-shape structures under the nano-structures in respective active regions in FIG. 7) protruding upwardly from the substrate 602 and adjacent to the isolation structure 604, S/D features 608 over the fins 606. The device 600 further includes a contact etch stop layer (CESL) 610 on sidewalls of the S/D features 608 and over the isolation structure 604, a first inter-layer dielectric (ILD) layer 612 over the CESL 269, and a second ILD layer 614 over the first ILD layer 612. The first and second ILD layers may be separated by an etch stop layer (ESL) 616. Not depicted in FIG. 13, but in the direction in-and-out of the paper, there are also one or more nano-structures (or channel layers) suspended over the fins 606 in the channel region of the transistors and connecting a pair of the S/D features 608 on two ends of the channel layers, a gate structure (or referred to as gate stack) wrapping around each of the nano-structures, and inner spacers between the S/D features 608 and the gate stack. The device 600 also includes a CMG feature 618 (e.g., corresponding to the CMG feature 130E in FIG. 11) divides the gate stack into segments, a gate spacer 619 disposed on sidewalls of the gate stack and extending into the source/drain region as on sidewalls of the buffer epitaxial layer 608a, an S/D contact 620 disposed on the two S/D features 608 and the CMG feature 618, and silicide features 622 interposed between the S/D features 608 and the S/D contact 620.

The device 600 further includes one or more interconnect layers with wires and vias embedded in dielectric layers. The one or more interconnect layers connecting gate, source, and drain electrodes of various transistors, as well as other circuits in the device 600, to form an integrated circuit in part or in whole. The device 600 may further include passivation layers, adhesion layers, and/or other layers built on the frontside of the device 600. These layers and the one or more interconnect layers are collectively denoted with the label 624. The interconnect layers 624 include an S/D contact via 626 landing on the S/D contact 620, a first metal line 628 in the M0 interconnect layer disposed on the S/D contact via 626, and a second metal line 630 in the M1 interconnect layer disposed on the first metal line 628. The various elements of the device 600 are further described below.

In some embodiments, the substrate 602 is a bulk silicon substrate (i.e., including bulk single-crystalline silicon). The substrate 602 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In an alternative embodiment, the substrate 602 is a semi-conductor-on-insulator substrate, such as a silicon-on-insulator (SOI) substrate, a silicon germanium-on-insulator (SGOI) substrate, or a germanium-on-insulator (GOI) substrate.

In some embodiments, the fins 606 may include silicon, silicon germanium, germanium, or other suitable semiconductor, and may be doped n-type or p-type dopants. The fin 606 may be patterned by any suitable method. For example, the fin 606 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fin 606. For example, the masking element may be used for etching recesses into semiconductor layers over or in the substrate 602, leaving the fins 606 on the substrate 602. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 606 may be suitable.

The isolation structure 604 may include silicon oxide, silicon nitride, silicon oxynitride, other suitable isolation material (for example, including silicon, oxygen, nitrogen, carbon, or other suitable isolation constituent), or combinations thereof. The isolation structure 604 can include different structures, such as shallow trench isolation (STI) features and/or deep trench isolation (DTI) features. In an embodiment, the isolation structure 604 can be formed by filling the trenches between the fins 606 with insulator material (for example, by using a CVD process or a spin-on glass process), performing a chemical mechanical polishing (CMP) process to remove excessive insulator material and/or or planarize a top surface of the insulator material layer, and etching back the insulator material layer to form the isolation structure 604. In some embodiments, the isolation structure 604 include multiple dielectric layers, such as a silicon nitride layer disposed over a thermal oxide liner layer.

The S/D features 608 include epitaxially grown one or more layers of semiconductor materials such as epitaxially grown silicon, germanium, or silicon germanium. In the depicted embodiment, the S/D features 608 includes a buffer epitaxial layer 608a, an intermediate layer 608b, and a doped epitaxial layer 608c. By way of example, epitaxial growth of the buffer epitaxial layer 608a may be performed by vapor-phase epitaxy (VPE), ultra-high vacuum chemical vapor deposition (UHV-CVD), molecular beam epitaxy (MBE), and/or other suitable processes. In some embodiments, the buffer epitaxial layer 608a include the same material as the substrate 602, such as silicon (Si). In some alternative embodiments, the buffer epitaxial layer 608a includes a different semiconductor material than the substrate 602, such as silicon germanium (SiGe). In some embodiments, the buffer epitaxial layer 608a is dopant-free, where for example, no intentional doping is performed during the epitaxial growth process. Alternatively, the buffer epitaxial layer 608a may be slightly doped with dopants such as Ge or Sn. As a comparison, in one instance, the substrate 602 is lightly doped and has a higher doping concentration than the buffer epitaxial layer 608a. The buffer epitaxial layer 608a provides a high resistance path from the upper portions of the S/D features to the semiconductor substrate, such that the leakage current through the semiconductor substrate is suppressed.

The intermediate layer 608b may be conformally deposited over the device 600. In various examples, the intermediate layer 608b is a nitride layer blanket deposited by a chemical vapor deposition (CVD) process, a subatmospheric CVD (SACVD) process, a flowable CVD process, an atomic layer deposition (ALD) process, a physical vapor deposition (PVD) process, and/or other suitable process. The intermediate layer 608b may be also referred to as a blanket nitride layer. In some embodiments, the blanket nitride layer 608b includes silicon nitride (SiN). Subsequently, the doped epitaxial layer 608c is formed on the blanket nitride layer 608b. After the forming of the doped epitaxial layer 608c, an etching process is performed to remove portions of the blanket nitride layer 608b not stacked between the epitaxial layers 608a and 608c. The blanket nitride layer 608b functions as an etch stop layer in subsequent backside etching process. By way of example, the doped epitaxial layer 608c may be formed by any epitaxy processes including VPE, UHV-CVD, MBE, and/or other suitable processes. The doped epitaxial layer 608c may be doped with n-type dopants and/or p-type dopants. In some embodiments, for n-type transistors, the doped epitaxial layer 608c include silicon and can be doped with carbon, phosphorous, arsenic, other n-type dopant, or combinations thereof (for example, forming Si:C epitaxial S/D features, Si:P epitaxial S/D features, or Si:C:P epitaxial S/D features). In some embodiments, for p-type transistors, the doped epitaxial layer 608c include silicon germanium or germanium, and can be doped with boron, other p-type dopant, or combinations thereof (for example, forming Si:Ge:B epitaxial S/D features). In one embodiment, the doped epitaxial layer 608c and the buffer epitaxial layer 608a are both formed of silicon (Si). In another embodiment, the doped epitaxial layer 608c is formed of silicon (Si) and the buffer epitaxial layer 608a is formed silicon germanium (SiGe). The doped epitaxial layer 608c may further include multiple epitaxial semiconductor layers having different levels of dopant density. In some embodiments, annealing processes (e.g., rapid thermal annealing (RTA) and/or laser annealing) are performed to activate dopants in the doped epitaxial layer 608c.

In some embodiments, the channel layers (nano-structures, not shown in FIG. 13) include a semiconductor material suitable for transistor channels, such as silicon, silicon germanium, or other semiconductor material(s). The channel layers may be in the shape of rods, bars, sheets, or other shapes in various embodiments. In an embodiment, the channel layers are initially part of a stack of semiconductor layers that include the channel layers and other sacrificial semiconductor layers alternately stacked layer-by-layer. The sacrificial semiconductor layers and the channel layers include different material compositions (such as different semiconductor materials, different constituent atomic percentages, and/or different constituent weight percentages) to achieve etching selectivity. During a gate replacement process to form the gate stack, the sacrificial semiconductor layers are selectively removed, leaving the channel layers suspended over the fins 606 in the channel region.

In some embodiment, the gate stack includes a gate dielectric layer and a gate electrode layer. The gate dielectric layer may include a high-k dielectric material such as $HfO_2$, or other suitable high-k dielectric material. The high-k dielectric material generally refers to dielectric materials having a high dielectric constant, for example, greater than that of silicon oxide ($k \approx 3.9$). The gate dielectric layer may be formed by chemical oxidation, thermal oxidation, ALD, CVD, and/or other suitable methods. In some embodiments, the gate stack further includes an interfacial layer between the gate dielectric layer and the channel layers. The interfacial layer may include silicon dioxide, silicon oxynitride, or other suitable materials. In some embodiments, the gate electrode layer includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer may be formed by CVD, PVD, plating, and/or other suitable processes. Since the gate stack includes a high-k dielectric layer and metal layer(s), it is also referred to as a high-k metal gate.

In some embodiments, the gate spacer 619 includes a dielectric material such as a dielectric material including silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In some embodiments, the gate spacer 619 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). For example, a dielectric layer including silicon and nitrogen, such as a silicon nitride layer, can be deposited over a dummy gate stack (which is subsequently replaced by the high-k metal gate) and subsequently etched (e.g., anisotropically etched) to form the gate spacer 619. The gate spacer 619 is deposited on sidewalls of the fins 606 not covered by the dummy gate stack such as in the source/drain region. After the fins 606 are recessed in the source/drain region and the S/D features 608 are epitaxially grown on remaining portions of the fins 606, the gate spacer 619 remains on sidewalls of the bottom portion of the S/D feature 608, such as on sidewalls of the buffer epitaxial layer 608a. In some embodiments, the gate spacer 619 includes a multi-layer structure, such as a first dielectric layer that includes silicon nitride and a second dielectric layer that includes silicon oxide.

In some embodiments, the CESL 610 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 612 and/or the ILD layer 614 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD layer 612 and/or the ILD layer 614 may be formed by PE-CVD (plasma enhanced CVD), F-CVD (flowable CVD), or other suitable methods.

In some embodiments, the silicide features 622 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

In an embodiment, the S/D contacts 620 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the S/D contacts 620.

Figure 13:
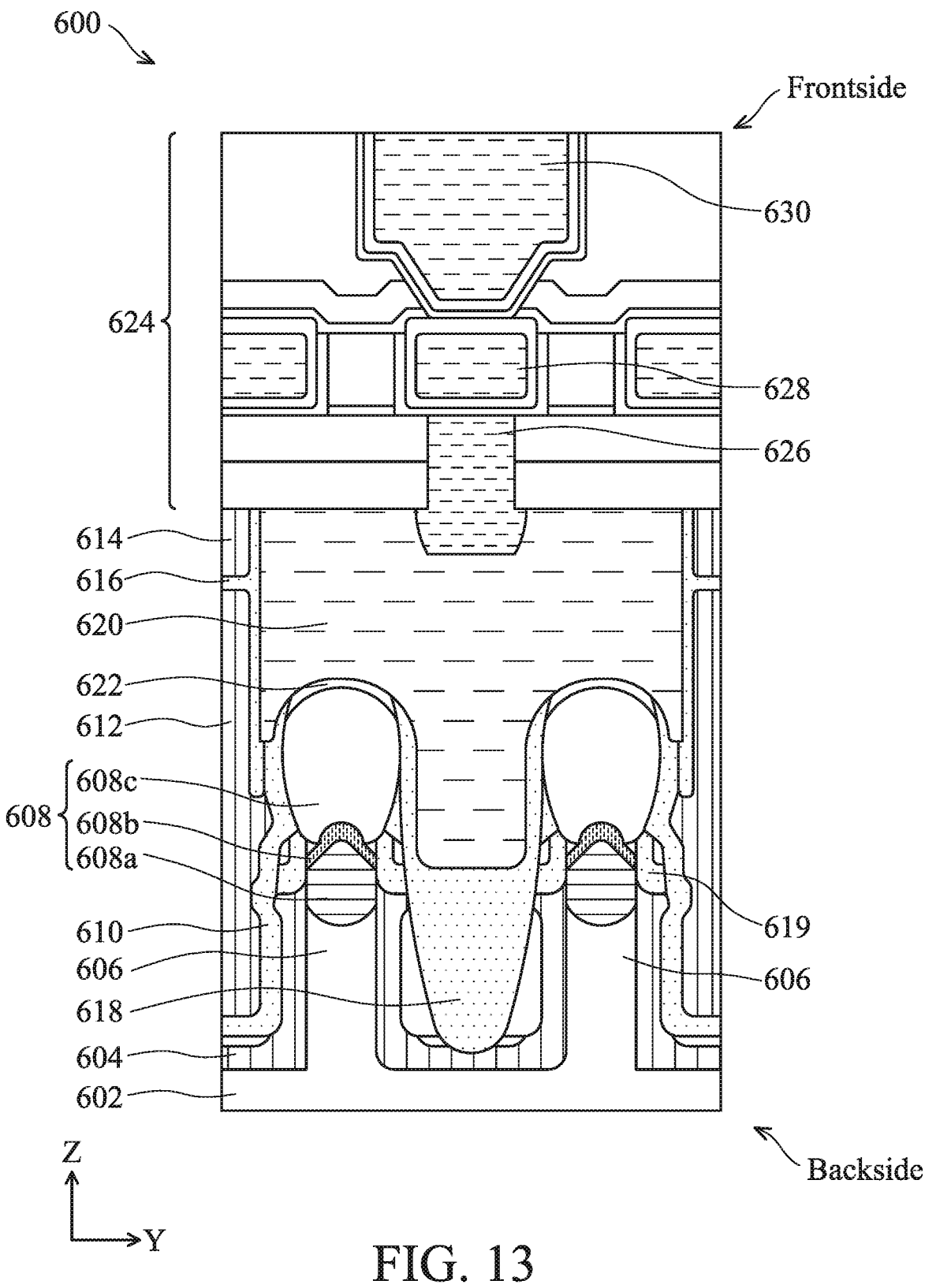
FIGS. 13, 14, 15, 16, 17, 18, 19, 20, and 21 illustrate cross-sectional views of an integrated circuit having SRAM cells during fabrication processes according to the method of FIG. 12, in accordance with some embodiments of the present disclosure.

In some embodiments, the CMG feature 618 may include one or more dielectric materials, such as silicon nitride, silicon oxide, silicon oxynitride, fluoride-doped silicate glass (FSG), a low-k dielectric material, and/or other suitable insulating material; and may be formed by CVD, PVD, ALD, or other suitable methods. The CMG feature 618 fills in a CMG trench and separates a gate structure into two segments in the channel region. The CMG feature 618 also extends into the source/drain region and disposes between the two adjacent S/D features 608. During the S/D contact formation, the CMG feature 618 is recessed in the source/drain region to form S/D recesses. As a result, a top surface of the CMG feature 618 in the channel region is above the S/D features 608, but a top surface of the CMG feature 618 in the source/drain region is below the S/D features 608, such as below a bottom surface of the dopped epitaxial layer 608c, as shown in FIG. 13.

In some embodiments, the S/D contact via 626 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD. ALD, plating, or other suitable processes. In some embodiments, the conductive barrier layer is omitted in the S/D contact via 626.

Figure 14:
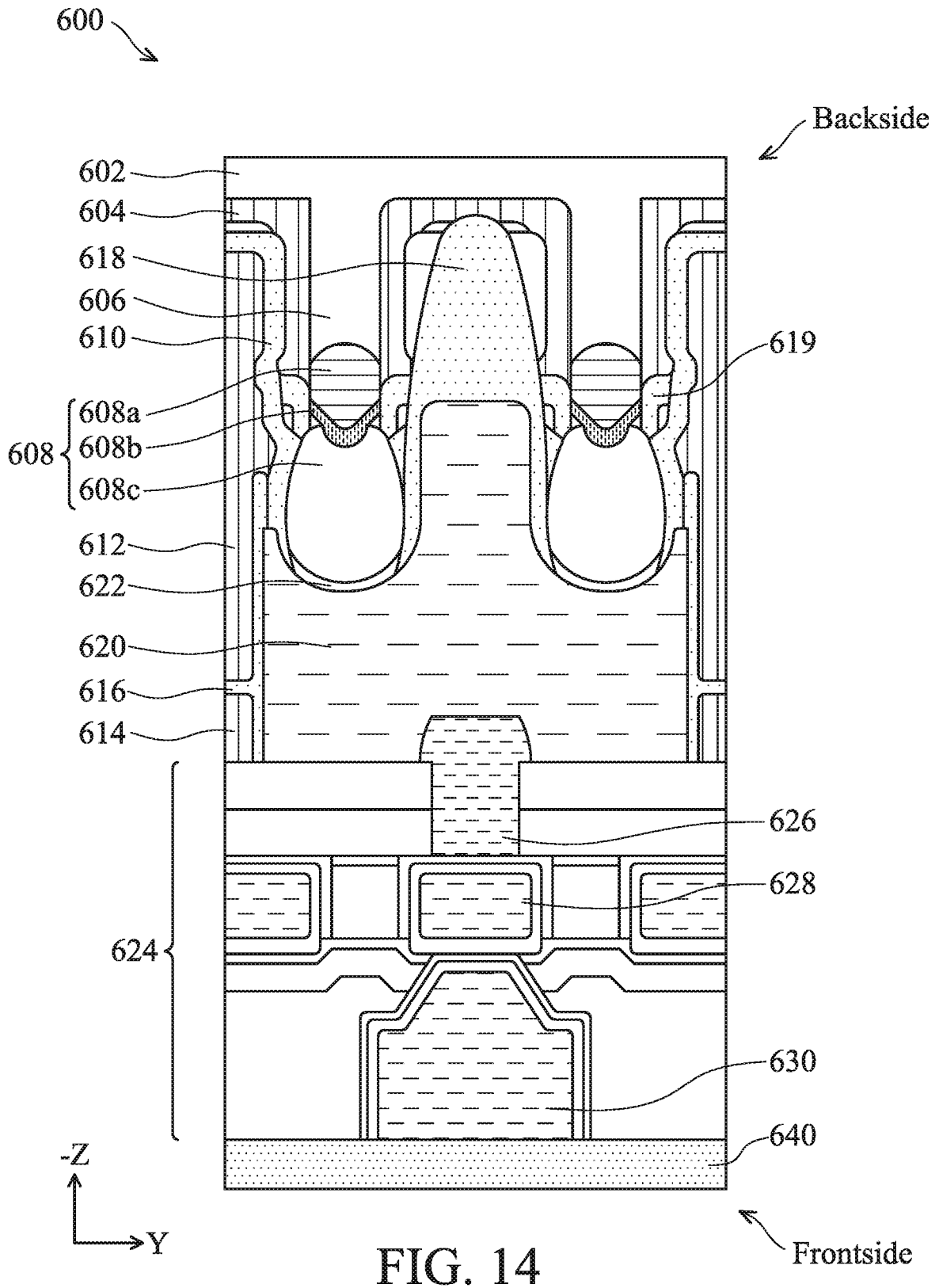

At operation 504, the method 500 (FIG. 12) flips the device 600 upside down and attaches the frontside of the device 600 to a carrier 640, such as shown in FIG. 14. This makes the device 600 accessible from the backside of the device 600 for further processing. The operation 504 may use any suitable attaching processes, such as direct bonding, hybrid bonding, using adhesive, or other bonding methods. The operation 504 may further include alignment, annealing, and/or other processes. The carrier 640 may be a silicon wafer in some embodiments. In FIGS. 13-21, the "Z" direction points from the backside of the device 600 to the frontside of the device 600, while the "−Z" direction points from the frontside of the device 600 to the backside of the device 600.

Figure 15:
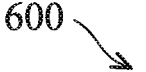

At operation 506, the method 500 (FIG. 12) thins down the device 600 from the backside of the device 600 until the fins 606 and the isolation structure 604 are exposed from the backside of the device 600, such as shown in FIG. 15. The thinning process may include a mechanical grinding process and/or a chemical thinning process. A substantial amount of substrate material may be first removed from the substrate 602 during a mechanical grinding process. Afterwards, a chemical thinning process may apply an etching chemical to the backside of the substrate 602 to further thin down the substrate 602.

Figure 16:
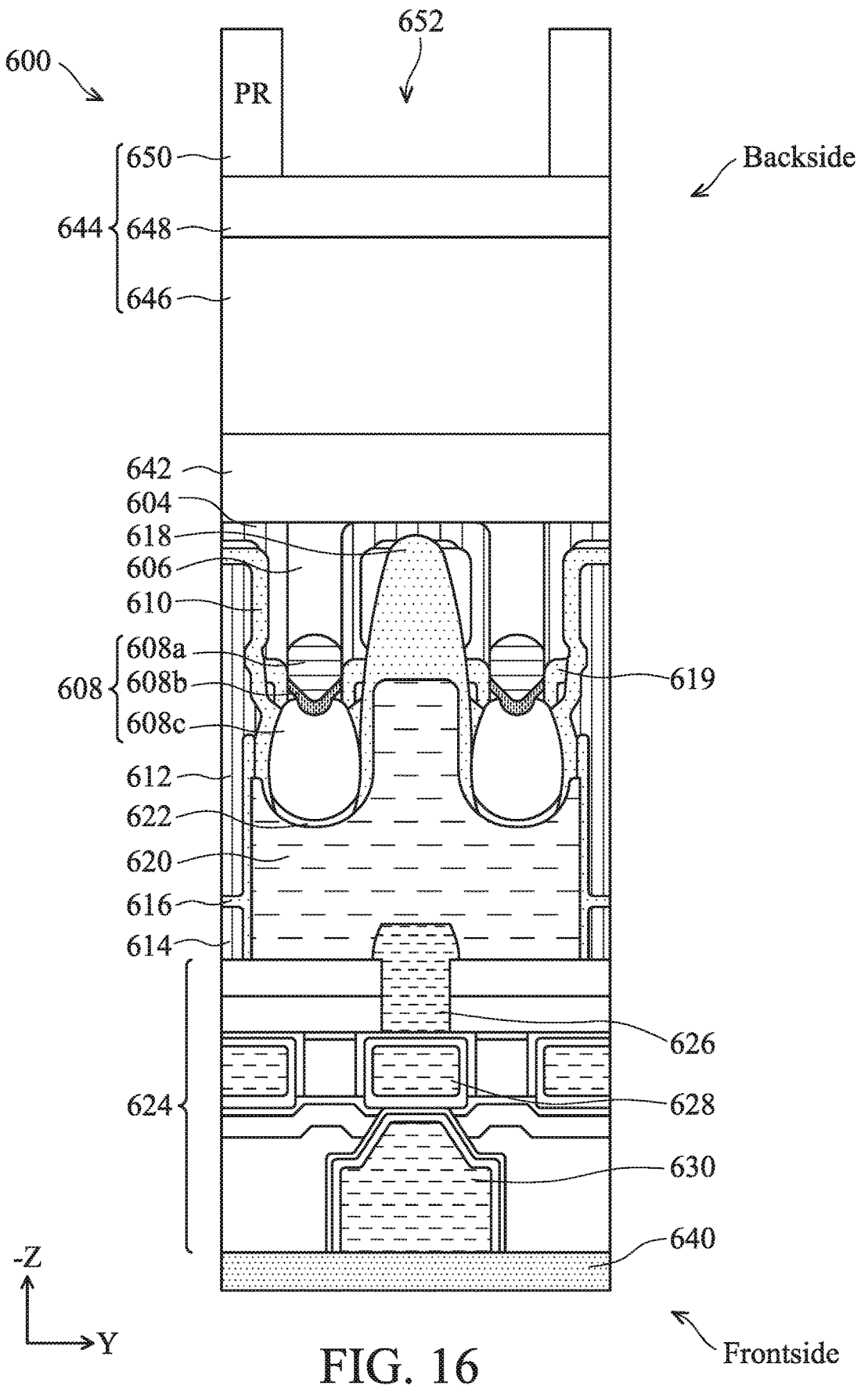

At operation 508, the method 500 (FIG. 12) forms a hardmask layer 642 over the backside of the device 600 and a tri-layer resist layer 644 over the hardmask layer 642, such as shown in FIG. 16. The hardmask layer 642 may include an oxide (e.g., $SiO_2$), a nitride (e.g., SiN), an oxy-nitride (e.g., $SiO_xN_y$), or the like. In further embodiments, the hardmask layer 642 is $SiO_2$. In yet further embodiments, the hardmask layer 642 is a high-temperature oxide (HTO) (e.g., $SiO_2$ formed by a high-temperature deposition/growth process). In some embodiments, a process for forming the hardmask layer 642 comprises depositing a dielectric material on the backside of the device 600 by, for example, CVD, PVD, ALD, sputtering, some other deposition process, or a combination thereof.

The tri-layer resist layer 644 includes a bottom layer 646 over the hardmask layer 642, a middle layer 648 over the bottom layer 646, and an upper layer 650 over the middle layer 648. The bottom layer 646 may be a bottom anti-reflective coating (BARC). The bottom layer 646 may include organic materials. The middle layer 648 may be formed from or include an inorganic material, which may be a nitride (such as silicon nitride), an oxynitride (such as silicon oxynitride), an oxide (such as silicon oxide), or the like. The upper layer 650 is a photosensitive material. The middle layer 648 has a high etching selectivity relative to the upper layer 650 and the bottom layer 646. As a result, the upper layer 650 is used as an etching mask for the patterning of the middle layer 648, and the middle layer 648 is used as an etching mask for the patterning of the bottom layer 646. In some embodiments, the resist layer formed over the hardmask layer 642 may be another type of photoresist, such as a single-layer photoresist, a bi-layer photoresist, or the like. The upper layer 650 is patterned using any suitable photolithography technique to form trench opening 652 therein. As an example of patterning the upper layer 650, the upper layer 650 may be exposed to a radiation beam including an UV or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser. Exposure of the photo-sensitive material may be performed using an immersion lithography system to increase resolution and decrease the minimum achievable pitch. A bake or cure operation may be performed to harden the upper layer 650, and a developer may be used to remove either the exposed or unexposed portions of the upper layer 650 depending on whether a positive or negative resist is used.

Figure 17:
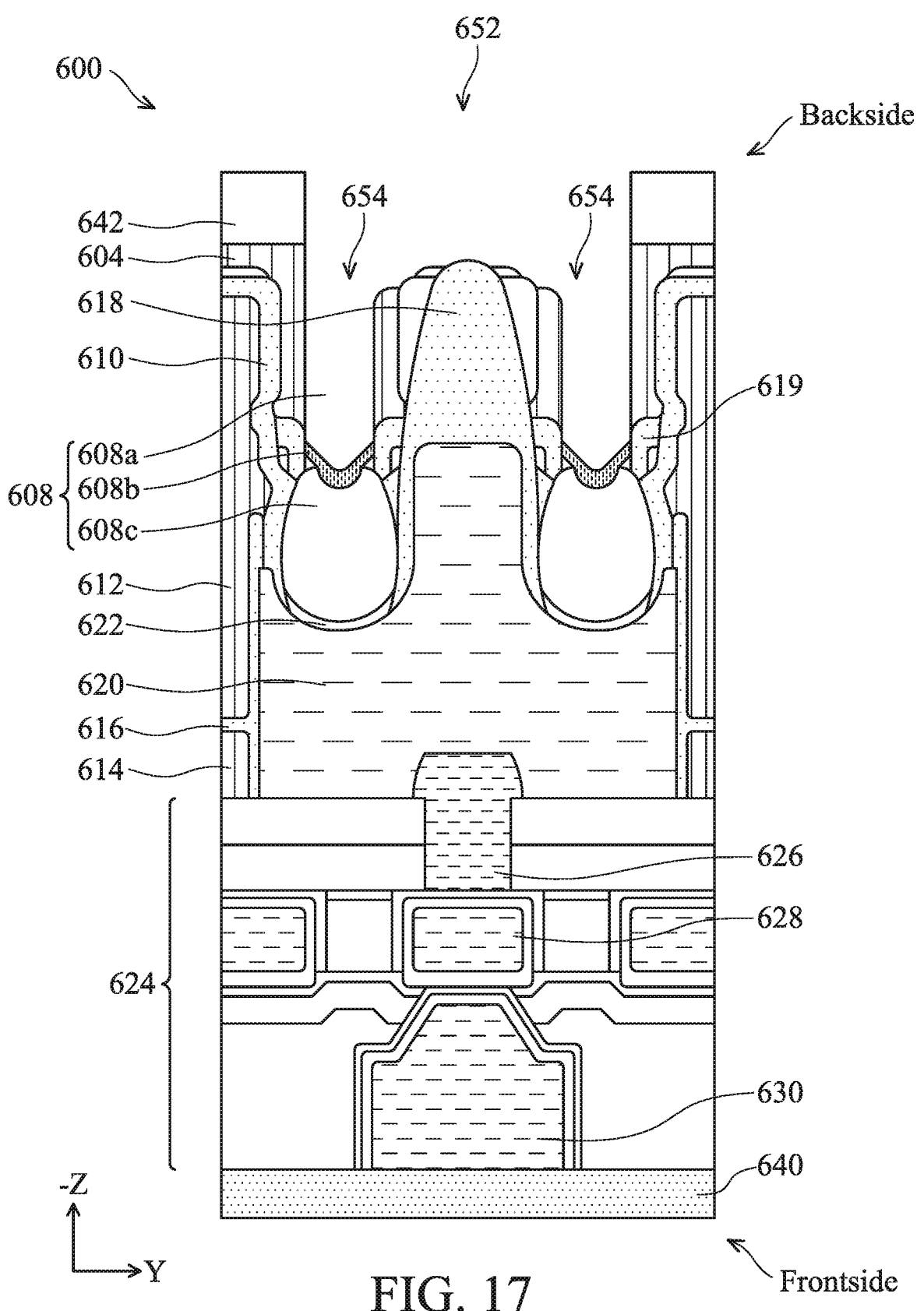

At operation 510, the method 500 (FIG. 12) extends the trench opening 652 to the hardmask layer 642 and selectively etches the fin 606 to form backside via holes 654 by etching through the trench opening 652, as shown in FIG. 17. The pattern of the upper layer 650 is transferred to the middle layer 648 using a suitable etching process. In some embodiments, the middle layer 648 may be trimmed, to increase the side of the trench opening 652 in the middle layer 648. After the trimming process, a suitable etching process is performed to transfer the pattern of the middle layer 648 to the bottom layer 646, thereby extending the trench opening 652 through the bottom layer 646. Further, the pattern of the bottom layer 646 is transferred to the hardmask layer 642 using a suitable etching process. In an embodiment, the etching process used to etch the bottom layer 646 is continued to etch the hardmask layer 642. During the etching process, the upper layer 650, middle layer 648, and bottom layer 646 may be consumed. In some embodiments, an ashing process may be performed to remove remaining residue of the bottom layer 646. After the pattern of the hardmask layer 642 exposes the backside of the device 600, the operation 510 applies an etching process that is tuned to be selective to the materials of the semiconductor material (e.g. silicon) in the fins 606. In the present embodiment, the etching process also etches the buffer epitaxial layer 608a of the S/D features 608. The blanket nitride layer 608b of the S/D features 608 functions as an etch stop layer to protect the doped epitaxial layer 608c from being etched. The etching of the fins 606 and the buffer epitaxial layer 608a may include a first etching to selectively etch the fins 606 and a second etching to selective etch the buffer epitaxial layer 608a. The etching process(es) can be dry etching, wet etching, reactive ion etching, or other suitable etching methods. The etching process(es) also consumes a horizontal portion of the isolation structure 604 covering the CMG feature 618, such that the bottom surface of the CMG feature 618 is exposed in the trench opening 652. Alternatively, the horizontal portion of the isolation structure 604 may be etched in a separate etch process that is selective to the materials of the isolation structure 604 with no (or minimum) etch lost to the CMG feature 618. The separate etching process may be an anisotropic etch process, such that the vertical portions of the isolation structure 604 disposed on sidewalls of the CMG feature 618 remain intact. The etch selectivity of the CMG feature 618 protects the gate stack from being accidentally exposed in the trench opening 652 if over-etch occurs, as the edge of the trench opening 652 may be getting too close to the gate stack in the X-direction during the etching process.

Figure 18:
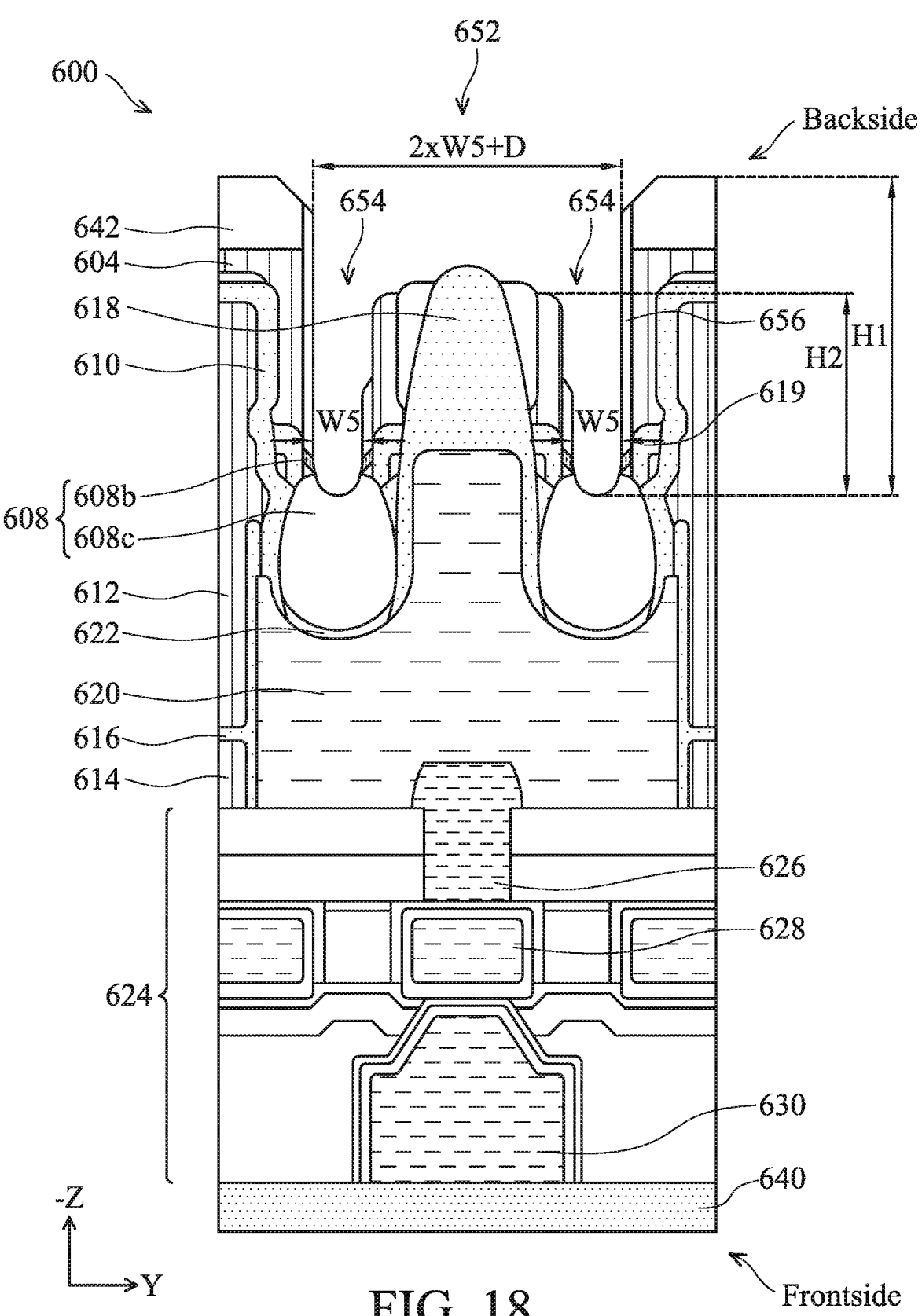

At operation 512, the method 500 (FIG. 12) deposits a dielectric liner 656 on sidewalls of the trench opening 652 (including backside via holes 654), such as shown in FIG. 18. The dielectric liner 656 further protects the gate stack from metal element diffusion when conductive features are subsequently formed in the trench opening 652. In the illustrated embodiment, the dielectric liner 656 is conformally deposited to have a substantially uniform thickness along the various surfaces of the backside of the device 600. In various embodiments, the dielectric liner 656 may include $La_2O_3$, $Al_2O_3$, SiOCN, SiOC, SiCN, $SiO_2$, SiC, ZnO, ZrN, $Zr_2Al_3O_9$, $TiO_2$. $TaO_2$, $ZrO_2$, $HfO_2$, $Si_3N_4$, $Y_2O_3$, AlON, TaCN, ZrSi, combinations thereof, or other suitable material (s). The dielectric liner 656 may be deposited using ALD, CVD, or other suitable methods. Subsequently, an etching process is performed for breaking through, and removing the majority of, the horizontal portions of the dielectric liner 656. The etching process is also referred to as a break-through (BT) etching process. In some embodiments, the BT etching process may include an anisotropic dry etch process, or the like. In some embodiments where the dielectric liner 656 is formed of an oxide compound, the BT etch process is a reactive ion etch (RIE) process with etch process gases including $CHF_3$, Ar, $CF_4$, $N_2$, $O_2$, $CH_2F_2$, $SF_3$, the like, or a combination thereof. The RIE process may be performed for an etch time between about 2 seconds and about 20 seconds, at a pressure between about 2 mTorr and about 30 mTorr, a temperature between about 10° C. and about 100° C., a radio frequency (RF) power between about 100 W and about 1500 W, and a voltage bias between about 10 V and about 800 V. In the illustrated embodiment, as a result of the operation 512, portions of the dielectric liner 656 remain on sidewalls of the isolation structure 604. The dielectric liner 656 may also be in contact with the gate spacer 619 and the blanket nitride layer 608*b* in the depicted embodiment. Due to the loading effect, a vertical length of the dielectric liner 656 on the sidewall close to the CMG feature 618 is lower than on the other sidewall close to the ILD layer 612. After the BT etching process, the blanket nitride layer 608*b* as an etch stop layer is exposed in the backside via holes 654. Subsequently, an etching process is applied to remove the exposed portion of the blanket nitride layer 608*b*. The etching process(es) can be dry etching, wet etching, reactive ion etching, or other etching methods. At the conclusion of the operation 512, the backside via holes 654 exposes bottom surface of the doped epitaxial layer 608*c* of the S/D features 260 from the backside. A portion of the blanket nitride layer 608*b* is remained between the doped epitaxial layer 608*c* and the dielectric liner 656.

The trench opening 652 provides a much larger opening than the backside via holes 654 alone. As discussed above, the trench opening 652 has an opening width 2W5+D along the Y-direction, which may be two to ten times larger than the opening width W5 of the backside via holes 654. Further, the aspect ratio of the backside via holes 654 is reduced to H2/W1 instead of H1/W1, which is about 30% to about 60% smaller. The expanding opening and the reduced-aspect-ratio of backside via holes enlarge the process window, reduce difficulty of filling conductive material(s) in other-wise high-aspect-ratio via holes, and mitigate overlaying inaccuracy in backside lithography processes.

Figure 19:
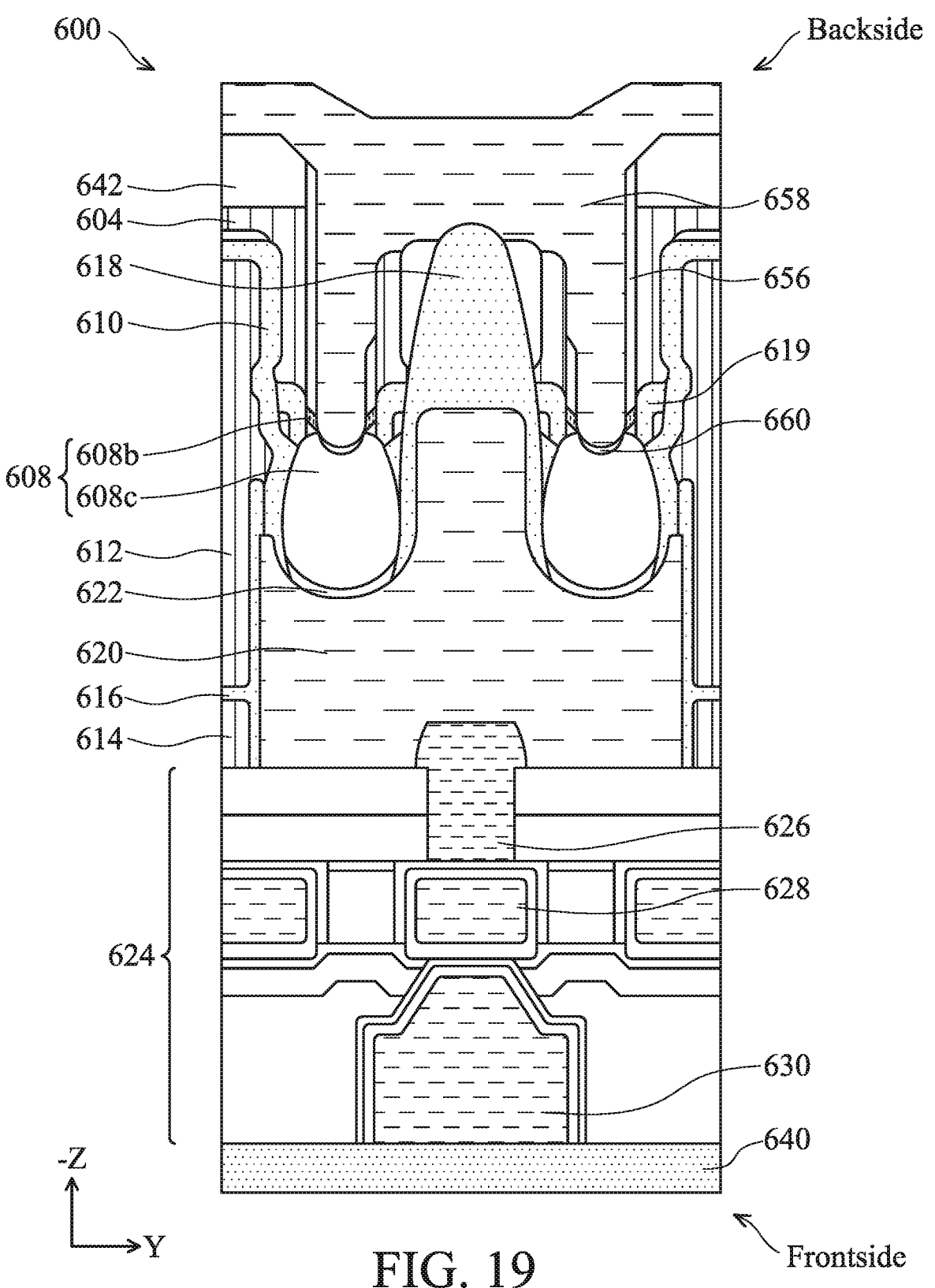
Figure 20:
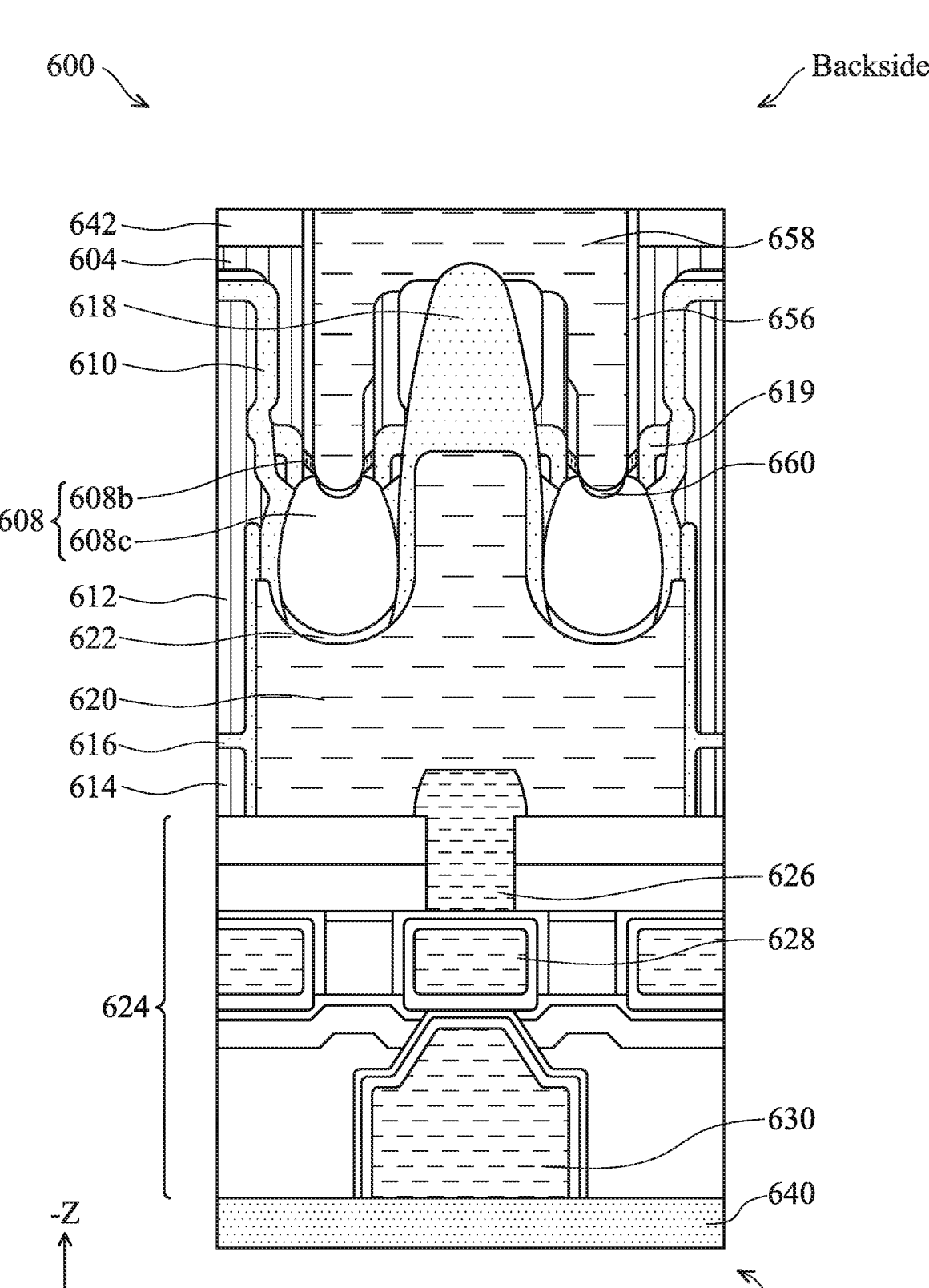

At operation 514, the method 500 (FIG. 12) forms a backside via 658 in the trench opening 652, as shown in FIGS. 19 and 20. In some embodiments, the backside via 658 is formed by filling the trench opening 652 (including the backside via holes 654) with one or more conductive materials, such as shown in FIG. 19, and subsequently removing excessive conductive materials from the backside of the device 600 in a planarization process, such as shown in FIG. 20. The leg portions of the backside via 658 filling the backside via holes 654 are landing on the two S/D features 608, and the middle portion of the backside via 658 is in contact with the CMG feature 618. The leg portions and the middle portion of the backside via 658 form a continuous conductive structure that ties the two S/D features 608 to the same power line (e.g., Vss). The backside via 658 may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be formed by CVD, PVD, ALD, plating, or other suitable processes. In the illustrated embodiment, the operation 514 forms a backside silicide feature 660 on the bottom surface of the doped epitaxial layer 608*c* of the S/D features 608. The backside silicide feature 660 reduces contact resistance between the S/D features 608 and the backside via 658. In furtherance of the embodiment, the operation 514 first deposits one or more metals into the backside via holes 654, performing an annealing process to the device 600 to cause reaction between the one or more metals and the S/D features 608 to produce the silicide feature, and removing un-reacted por-tions of the one or more metals, leaving the silicide feature in the backside via holes 654. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The backside silicide feature 660 may include titanium silicide (TiSi), nickel silicide (NiSi), tungsten silicide (WSi), nickel-platinum sili-cide (NiPtSi), nickel-platinum-germanium silicide (NiPt-GeSi), nickel-germanium silicide (NiGeSi), ytterbium sili-cide (YbSi), platinum silicide (PtSi), iridium silicide (IrSi), erbium silicide (ErSi), cobalt silicide (CoSi), a combination thereof, or other suitable compounds. Alternatively, the backside via 658 may directly contact the two S/D features 608. A planarization operation, such as a chemical mechani-cal polishing (CMP) process, may also be performed to remove excessive conductive material and expose the back-side of the hardmask layer 642, such as shown in FIG. 20.

Figure 21:
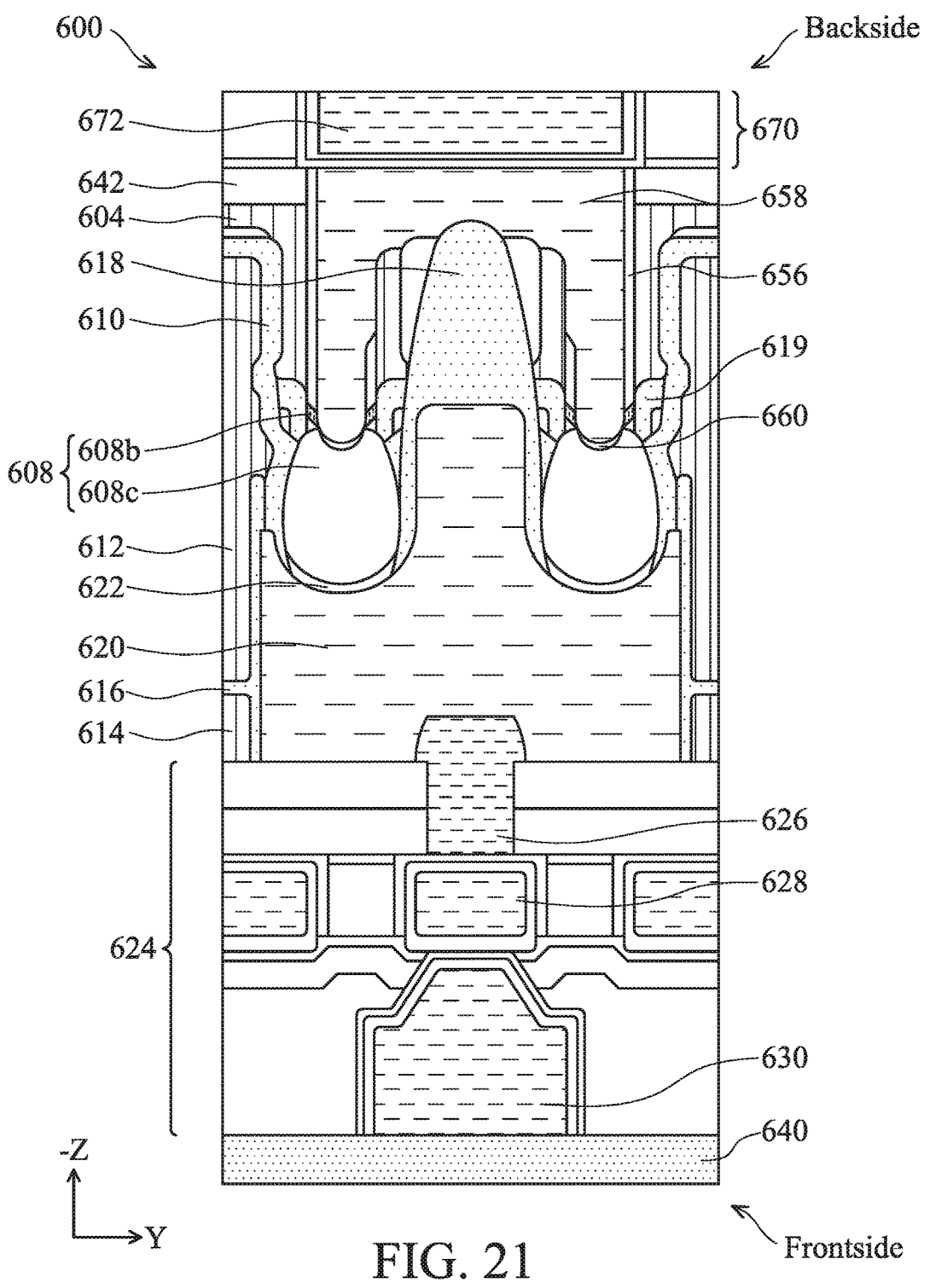

At operation 516, the method 500 (FIG. 12) forms one or more backside interconnect layers 670 with backside power rails embedded in dielectric layers on the backside of the device 600, such as shown in FIG. 21. In the illustrated embodiment, the backside power rails include a backside metal line 672 (e.g., in a backside M0 interconnect layer) that lands on the backside via 658 and electrically couples the two S/D features 608 to the grounding line VSS. The backside metal line 672 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodi-ments, the conductive barrier layer is omitted. The backside power rails may further include other backside metal lines that electrically couple other backside vias to power line VDD and/or signal lines. In an embodiment, the backside power rails may be formed using a damascene process, a dual-damascene process, a metal patterning process, or other suitable processes. Although not shown in FIG. 21, the backside power rails may include multiple backside inter-connect layers that include contacts, vias, wires, and/or other conductive features. Having backside power rails benefi-cially increases the number of metal tracks available in the device 600 for directly connecting to source/drain contacts and vias. The backside power rails may have wider dimension than the first level metal (M0) tracks on the frontside of the device 600, which beneficially reduces the backside power rail resistance.

In summary, the present disclosure involves implementing a two-port SRAM device with gate-all-around (GAA) transistors, and to use different channel widths for the different transistors. The present disclosure also configures the backside vias straddling the gate-cut dielectric features, allowing a relatively larger backside contact area to be reserved between S/D features and a backside power rail, effectively reducing contact resistance and enlarging process windows. Moreover, a relatively larger backside contact area provides better overlay control between backside via and S/D features. Further, embodiments of the present disclosure can be readily integrated into existing semiconductor manufacturing processes.

In one exemplary aspect, the present disclosure is directed to a memory cell. The memory cell includes a first active region providing a plurality of first nano-structures for a write-port pass-gate transistor, the first active region having a first width, a second active region providing a plurality of second nano-structures for a write-port pull-up transistor, the second active region having a second width, and a third active region providing a plurality of third nano-structures for a read-port pull-down transistor, the third active region having a third width, the third width being larger than the first width, and the first width being larger than the second width. In some embodiments, a ratio of the first width and the second width ranges from about 1.5:1 to about 5:1. In some embodiments, a ratio of the third width and the first width ranges from about 1.1:1 to about 3:1. In some embodiments, the memory cell also includes a gate structure line extending across over the first, second, and third active regions, and a gate-cut dielectric feature dividing the gate structure line into a first gate structure wrapping each of the first nano-structures and a second gate structure wrapping each of the second and third nano-structures. In some embodiments, the gate-cut dielectric feature extends vertically deeper in a region in the gate structure line than in a region outside of the gate structure line. In some embodiments, the gate-cut dielectric feature is a first gate-cut dielectric feature, and the memory cell also includes a second gate-cut dielectric feature abutting the second gate structure. In some embodiments, the memory cell also includes a backside contact straddling the second gate-cut dielectric feature. In some embodiments, the memory cell also includes a fourth active region providing a plurality of fourth nano-structures for a write-port pull-down transistor, the fourth active region having a fourth width, the third width being larger than the fourth width, and the fourth width being larger than the second width. In some embodiments, the fourth width is different from the first width. In some embodiments, the memory cell also includes a fourth active region providing a plurality of fourth nano-structures for a write-port pull-up transistor, the fourth active region having a fourth width, the fourth width being smaller than the first width, and the fourth width being different from the second width.

In another exemplary aspect, the present disclosure is directed to a semiconductor structure. The semiconductor structure includes first and second active regions extending lengthwise along a first direction, a gate stack extending lengthwise along a second direction perpendicular to the first direction, a dielectric feature disposed between the first and second active regions, the dielectric feature dividing the gate stack into a first segment over the first active region and a second segment over the second active region, a first epitaxial feature disposed on the first active region, a second epitaxial feature disposed on the second active region, the first and second epitaxial features being disposed on two opposing sides of the dielectric feature, and a backside conductive feature electrically coupled to the first and second epitaxial features and straddling the dielectric feature. In some embodiments, the dielectric feature extends lengthwise along the first direction. In some embodiments, the backside conductive feature includes a first leg portion landing on a bottom surface of the first epitaxial feature, a second leg portion landing on a bottom surface of the second epitaxial feature, and a middle portion physically connecting the first and second leg portions, the middle portion directly under the dielectric feature. In some embodiments, the middle portion is in physical contact with the dielectric feature. In some embodiments, the semiconductor structure also includes a frontside contact disposed on the first and second epitaxial features, the dielectric feature being vertically stacked between the frontside contact and the backside conductive feature. In some embodiments, the frontside contact expands in the second direction wider than the backside conductive feature. In some embodiments, the first and second segments of the gate stack are configured to engage the first and second active regions to form first and second transistors, respectively, in first and second read-ports of first and second memory cells in a memory array.

In yet another exemplary aspect, the present disclosure is directed to a method. The method includes forming a first fin and a second fin protruding from a frontside of a substrate, forming a gate stack over the first and second fins, forming a dielectric feature dividing the gate stack into a first segment engaging the first fin to form a first transistor and a second segment engaging the second fin to form a second transistor, wherein the first and second transistors are read-port transistors, growing a first epitaxial feature on the first fin and a second epitaxial feature on the second fin, wherein the dielectric feature is disposed between the first and second epitaxial features, performing an etching process on a backside of the substrate to form a backside trench, the backside trench exposing the dielectric feature and the first and second epitaxial features, and forming a backside via in the backside trench, the backside via straddling the dielectric feature and is in electrical connection with the first and second epitaxial features. In some embodiments, the performing of the etching process includes etching the first and second fins from the backside of the substrate. In some embodiments, the etching of the first and second fins forms a first via hole and a second via hole extending from the backside trench and exposing the first and second epitaxial features respectively, the first and second via holes are disposed on two opposing sides of the dielectric feature, and the forming of the backside via includes filling the first and second via holes and the backside trench with a conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
a first active region providing a plurality of first nano-structures for a write-port pass-gate transistor, the first active region having a first width;
a second active region providing a plurality of second nano-structures for a write-port pull-up transistor, the second active region having a second width; and
a third active region providing a plurality of third nano-structures for a read-port pull-down transistor, the third active region having a third width,
wherein the third width is larger than the first width, and the first width is larger than the second width.

2. The memory cell of claim 1, wherein a ratio of the first width and the second width ranges from about 1.5:1 to about 5:1.

3. The memory cell of claim 1, wherein a ratio of the third width and the first width ranges from about 1.1:1 to about 3:1.

4. The memory cell of claim 1, further comprising:
a gate structure line extending across over the first, second, and third active regions; and
a gate-cut dielectric feature dividing the gate structure line into a first gate structure wrapping each of the first nano-structures and a second gate structure wrapping each of the second and third nano-structures.

5. The memory cell of claim 4, wherein the gate-cut dielectric feature extends vertically deeper in a region in the gate structure line than in a region outside of the gate structure line.

6. The memory cell of claim 4, wherein the gate-cut dielectric feature is a first gate-cut dielectric feature, the memory cell further comprising:
a second gate-cut dielectric feature abutting the second gate structure.

7. The memory cell of claim 6, further comprising:
a backside contact straddling the second gate-cut dielectric feature.

8. The memory cell of claim 1, further comprising:
a fourth active region providing a plurality of fourth nano-structures for a write-port pull-down transistor, the fourth active region having a fourth width,
wherein the third width is larger than the fourth width, and the fourth width is larger than the second width.

9. The memory cell of claim 8, wherein the fourth width is different from the first width.

10. The memory cell of claim 1, further comprising:
a fourth active region providing a plurality of fourth nano-structures for a write-port pull-up transistor, the fourth active region having a fourth width,
wherein the fourth width is smaller than the first width, and the fourth width is different from the second width.

11. A semiconductor structure, comprising:
first and second active regions extending lengthwise along a first direction;
a gate stack extending lengthwise along a second direction perpendicular to the first direction;
a dielectric feature disposed between the first and second active regions, wherein the dielectric feature divides the gate stack into a first segment over the first active region and a second segment over the second active region;
a first epitaxial feature disposed on the first active region;

a second epitaxial feature disposed on the second active region, wherein the first and second epitaxial features are disposed on two opposing sides of the dielectric feature; and
a backside conductive feature electrically coupled to the first and second epitaxial features and straddling the dielectric feature.

12. The semiconductor structure of claim 11, wherein the dielectric feature extends lengthwise along the first direction.

13. The semiconductor structure of claim 11, wherein the backside conductive feature includes a first leg portion landing on a bottom surface of the first epitaxial feature, a second leg portion landing on a bottom surface of the second epitaxial feature, and a middle portion physically connecting the first and second leg portions, wherein the middle portion is directly under the dielectric feature.

14. The semiconductor structure of claim 13, wherein the middle portion is in physical contact with the dielectric feature.

15. The semiconductor structure of claim 11, further comprising:
a frontside contact disposed on the first and second epitaxial features, wherein the dielectric feature is vertically stacked between the frontside contact and the backside conductive feature.

16. The semiconductor structure of claim 15, wherein the frontside contact expands in the second direction wider than the backside conductive feature.

17. The semiconductor structure of claim 11, wherein the first and second segments of the gate stack are configured to engage the first and second active regions to form first and second transistors, respectively, in first and second read-ports of first and second memory cells in a memory array.

18. A semiconductor structure, comprising:
a first memory cell, the first memory cell comprising:
a first active region providing a plurality of first nano-structures for a write-port pull-down transistor of the first memory cell;
a second active region providing a plurality of second nano-structures for a write-port pull-up transistor of the first memory cell; and
a third active region providing a plurality of third nano-structures for a read-port pull-down transistor of the first memory cell;
a second memory cell abutting the first memory cell, the second memory cell comprising:
a fourth active region providing a plurality of fourth nano-structures for a write-port pull-down transistor of the second memory cell;
a fifth active region providing a plurality of fifth nano-structures for a write-port pull-up transistor of the second memory cell; and
a sixth active region providing a plurality of sixth nano-structures for a read-port pull-down transistor of the second memory cell;
a gate structure line extending across over the first, second, third, fourth, fifth, and sixth active regions;
a gate-cut dielectric feature dividing the gate structure line into a first gate structure wrapping each of the first, second, and third nano-structures and a second gate structure wrapping each of the fourth, fifth, and sixth nano-structures; and
a backside contact straddling the gate-cut dielectric feature and in electrical coupling with bottom surfaces of the third and sixth active regions.

19. The semiconductor structure of claim 18, wherein the backside contact has a first leg portion in electrical coupling with the bottom surface of the third active region, a second leg portion in electrical coupling with the bottom surface of the sixth active region, and a bridging portion connecting the first and second leg portions.

20. The semiconductor structure of claim 19, wherein the bridging portion interfaces with a bottom surface of the gate-cut dielectric feature.

* * * * *